(12) United States Patent  
Yamazaki et al.

(10) Patent No.: US 8,647,919 B2
(45) Date of Patent: Feb. 11, 2014

(54) LIGHT-EMITTING DISPLAY DEVICE AND METHOD FOR MANUFACTURING THE SAME

(75) Inventors: Shunpei Yamazaki, Tokyo (JP); Kaoru Hatano, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/227,074

(22) Filed: Sep. 7, 2011

(65) Prior Publication Data

US 2012/0061664 A1   Mar. 15, 2012

(30) Foreign Application Priority Data

Sep. 13, 2010   (JP) .................. 2010-204935

(51) Int. Cl.
  *H01L 21/00*   (2006.01)
  *H01L 21/16*   (2006.01)
(52) U.S. Cl.
  USPC ............... 438/104; 257/E21.46; 257/E33.053
(58) Field of Classification Search
  USPC ................ 257/43, E21.46, E33.053; 438/104
  See application file for complete search history.

(56) References Cited

U.S. PATENT DOCUMENTS

| 5,477,355 | A | 12/1995 | Sasaki et al. |
| 5,731,856 | A | 3/1998 | Kim et al. |
| 5,744,864 | A | 4/1998 | Cillessen et al. |
| 5,886,761 | A | 3/1999 | Sasaki et al. |
| 6,294,274 | B1 | 9/2001 | Kawazoe et al. |
| 6,544,823 | B1 * | 4/2003 | Yamazaki et al. ............ 438/151 |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,335,573 | B2 | 2/2008 | Takayama et al. |

(Continued)

FOREIGN PATENT DOCUMENTS

EP   1 737 044 A1   12/2006
EP   2 226 847 A2    9/2010

(Continued)

OTHER PUBLICATIONS

Asakuma, N. et al. "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — David S Blum
(74) *Attorney, Agent, or Firm* — Fish & Richardson P.C.

(57) ABSTRACT

Provided is a method to manufacture a light-emitting display device in which a contact hole for the electrical connection of the pixel electrode and one of the source and drain electrode of a transistor and a contact hole for the processing of a semiconductor layer are formed simultaneously. The method contributes to the reduction of a photography step. The transistor includes an oxide semiconductor layer where a channel formation region is formed.

14 Claims, 15 Drawing Sheets

(56) References Cited

U.S. PATENT DOCUMENTS

| | | |
|---|---|---|
| 7,385,224 B2 | 6/2008 | Ishii et al. |
| 7,402,506 B2 | 7/2008 | Levy et al. |
| 7,411,209 B2 | 8/2008 | Endo et al. |
| 7,430,034 B2 | 9/2008 | Jeoung |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,495,252 B2 | 2/2009 | Ahn et al. |
| 7,501,293 B2 | 3/2009 | Ito et al. |
| 7,601,984 B2 | 10/2009 | Sano et al. |
| 7,648,861 B2* | 1/2010 | Yamazaki et al. ............ 438/149 |
| 7,674,650 B2 | 3/2010 | Akimoto et al. |
| 7,732,819 B2* | 6/2010 | Akimoto et al. ................ 257/72 |
| 7,919,396 B2 | 4/2011 | Ahn et al. |
| 7,994,500 B2 | 8/2011 | Kim et al. |
| 8,039,840 B2* | 10/2011 | Hosoya ............................ 257/59 |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 2001/0030718 A1* | 10/2001 | Yoo et al. ........................ 349/43 |
| 2001/0046027 A1 | 11/2001 | Tai et al. |
| 2002/0043682 A1* | 4/2002 | Yamazaki et al. ............ 257/314 |
| 2002/0056838 A1 | 5/2002 | Ogawa |
| 2002/0105614 A1* | 8/2002 | Nakayama et al. ........... 349/143 |
| 2002/0113239 A1* | 8/2002 | Uochi et al. ..................... 257/72 |
| 2002/0132454 A1 | 9/2002 | Ohtsu et al. |
| 2003/0043308 A1* | 3/2003 | Yoo et al. ........................ 349/43 |
| 2003/0075733 A1* | 4/2003 | Yamazaki et al. ............ 257/200 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0012887 A1* | 1/2005 | Koyama et al. ............... 349/151 |
| 2005/0017302 A1 | 1/2005 | Hoffman |
| 2005/0056837 A1* | 3/2005 | Ohtani et al. .................... 257/57 |
| 2005/0134752 A1* | 6/2005 | Yang et al. ...................... 349/42 |
| 2005/0199959 A1 | 9/2005 | Chiang et al. |
| 2006/0027804 A1* | 2/2006 | Yamazaki et al. .............. 257/59 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0113894 A1* | 6/2006 | Fujii et al. ...................... 313/499 |
| 2006/0145157 A1* | 7/2006 | Choi et al. ....................... 257/66 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2006/0292865 A1* | 12/2006 | Yamazaki et al. ............ 438/666 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0145372 A1* | 6/2007 | Yamazaki et al. .............. 257/66 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1* | 8/2007 | Furuta et al. .................. 257/347 |
| 2007/0194379 A1 | 8/2007 | Hosono et al. |
| 2007/0252928 A1 | 11/2007 | Ito et al. |
| 2007/0262318 A1* | 11/2007 | Shoji et al. ...................... 257/72 |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0049437 A1 | 2/2008 | Takayama et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0105875 A1* | 5/2008 | Maekawa et al. ............... 257/72 |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0303408 A1* | 12/2008 | Yamazaki et al. ............ 313/498 |
| 2009/0047758 A1* | 2/2009 | Yamazaki et al. ............ 438/158 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1* | 5/2009 | Sakakura et al. ................ 257/72 |
| 2009/0140259 A1* | 6/2009 | Yamazaki ........................ 257/67 |
| 2009/0146150 A1* | 6/2009 | Hosoya ............................ 257/59 |
| 2009/0152506 A1 | 6/2009 | Umeda et al. |
| 2009/0152541 A1 | 6/2009 | Maekawa et al. |
| 2009/0239320 A1* | 9/2009 | Takayama et al. .............. 438/27 |
| 2009/0278122 A1 | 11/2009 | Hosono et al. |
| 2009/0280600 A1 | 11/2009 | Hosono et al. |
| 2009/0291516 A1* | 11/2009 | Takayama et al. .............. 438/26 |
| 2009/0291536 A1* | 11/2009 | Ohnuma et al. .............. 438/151 |
| 2010/0006844 A1 | 1/2010 | Kim et al. |
| 2010/0065844 A1 | 3/2010 | Tokunaga |
| 2010/0072469 A1* | 3/2010 | Yamazaki et al. .............. 257/43 |
| 2010/0092800 A1 | 4/2010 | Itagaki et al. |
| 2010/0099216 A1* | 4/2010 | Suzawa et al. ................ 438/104 |
| 2010/0105163 A1 | 4/2010 | Ito et al. |
| 2010/0109002 A1 | 5/2010 | Itagaki et al. |
| 2010/0159639 A1* | 6/2010 | Sakata .......................... 438/104 |
| 2010/0163865 A1 | 7/2010 | Arai |
| 2010/0301327 A1* | 12/2010 | Kang et al. ...................... 257/43 |
| 2010/0320458 A1 | 12/2010 | Umeda et al. |
| 2010/0320459 A1 | 12/2010 | Umeda et al. |
| 2011/0031493 A1* | 2/2011 | Yamazaki et al. .............. 257/43 |
| 2011/0084265 A1 | 4/2011 | Arasawa et al. |
| 2011/0085104 A1 | 4/2011 | Arasawa et al. |
| 2011/0193083 A1 | 8/2011 | Kim et al. |
| 2011/0215328 A1 | 9/2011 | Morosawa et al. |
| 2012/0052606 A1 | 3/2012 | Yamazaki |
| 2012/0052625 A1* | 3/2012 | Yamazaki ...................... 438/104 |
| 2012/0061665 A1 | 3/2012 | Miyake et al. |
| 2012/0061673 A1 | 3/2012 | Yamazaki et al. |
| 2012/0062813 A1 | 3/2012 | Koyama |
| 2012/0062814 A1 | 3/2012 | Yamazaki et al. |
| 2012/0064650 A1 | 3/2012 | Yamazaki et al. |
| 2012/0119205 A1 | 5/2012 | Taniguchi et al. |
| 2012/0218485 A1* | 8/2012 | Chikama et al. ................ 349/39 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-203987 A | 8/1993 |
| JP | 05-251705 A | 9/1993 |

(56) References Cited

FOREIGN PATENT DOCUMENTS

| | | | |
|---|---|---|---|
| JP | 08-264794 A | 10/1996 | |
| JP | 11-505377 A | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2003179069 A | 6/2003 | |
| JP | 2004-103957 A | 4/2004 | |
| JP | 2004-273614 A | 9/2004 | |
| JP | 2004-273732 A | 9/2004 | |
| JP | 2005077822 A | 3/2005 | |
| JP | 2009-231613 A | 10/2009 | |
| JP | 2010-016347 A | 1/2010 | |
| JP | 4415062 B1 | 2/2010 | |
| JP | 2010-067954 A | 3/2010 | |
| JP | 2010-177431 A | 8/2010 | |
| JP | 4571221 B1 | 10/2010 | |
| JP | 2012-160679 A | 8/2012 | |
| WO | 2004/114391 A1 | 12/2004 | |
| WO | 2008/133345 A1 | 11/2008 | |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kamiya, T et al., "Carrier transport properties and electronic structures of amorphous oxide semiconductors: the present status," Solid State Physics, Agne Gijutsu Center, Sep. 1, 2009, vol. 44, No. 9, pp. 621-634 with English translation.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13TH International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

(56) References Cited

OTHER PUBLICATIONS

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6TH International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTS," IDW '09 : Proceedings of the 16TH International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15TH International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, p. 21-008, with full English translation.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center, with English translation.

Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; Mar. 17, 2010; p. 21-008, with English translation.

\* cited by examiner

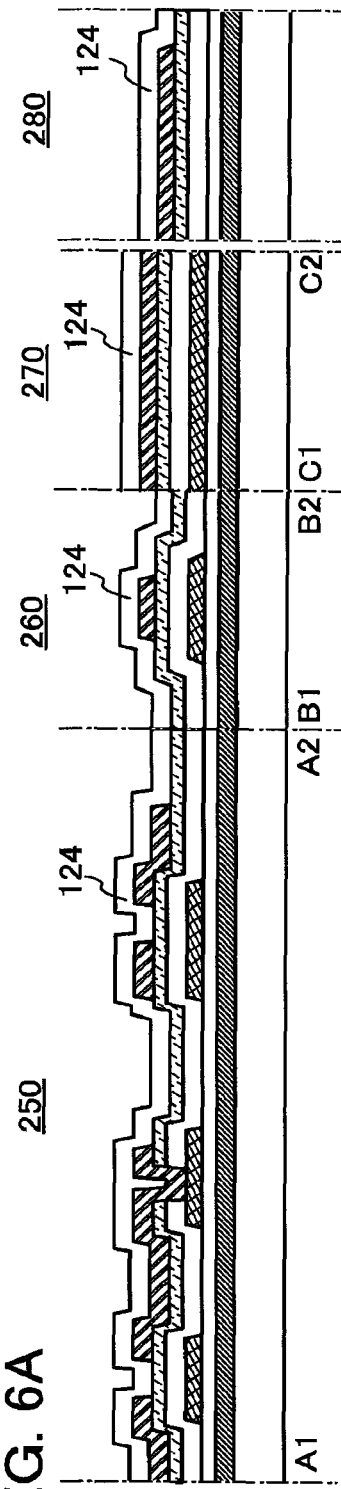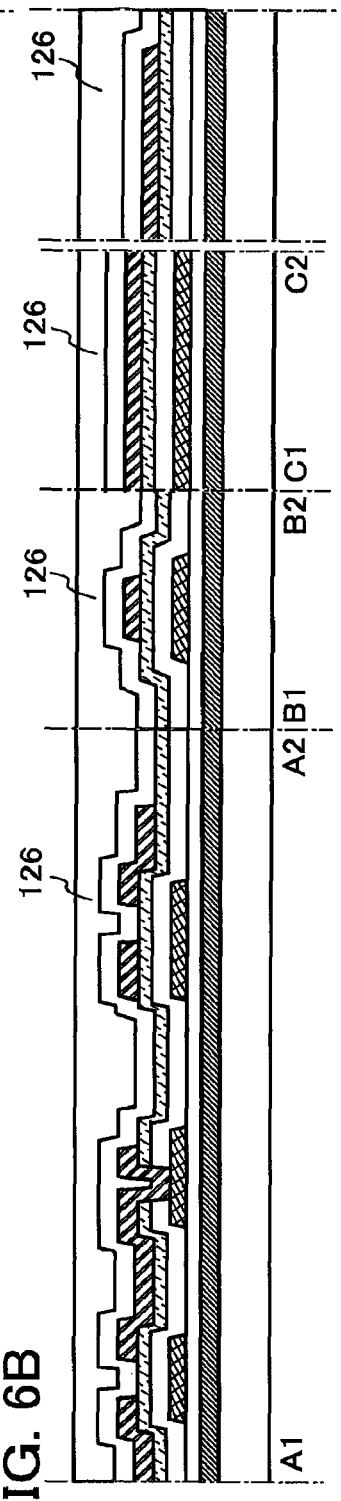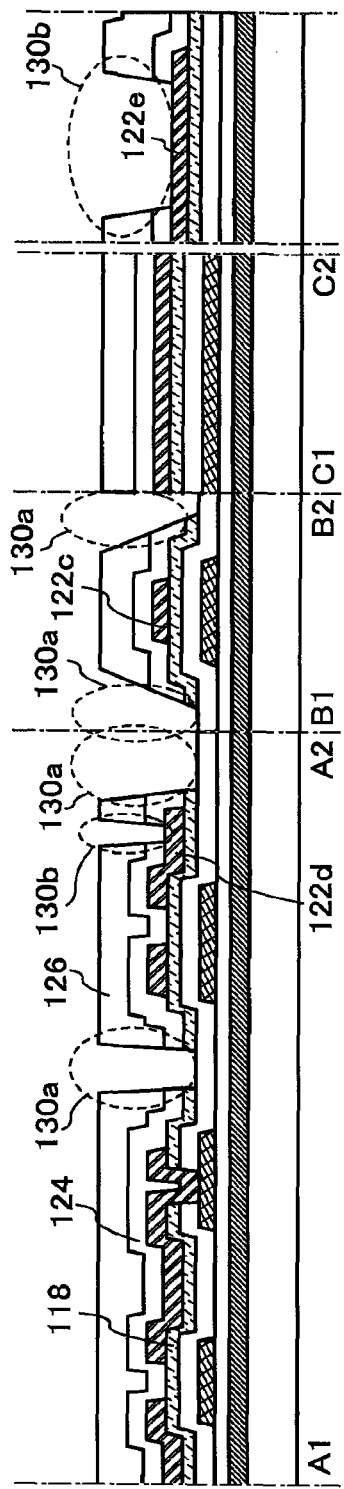

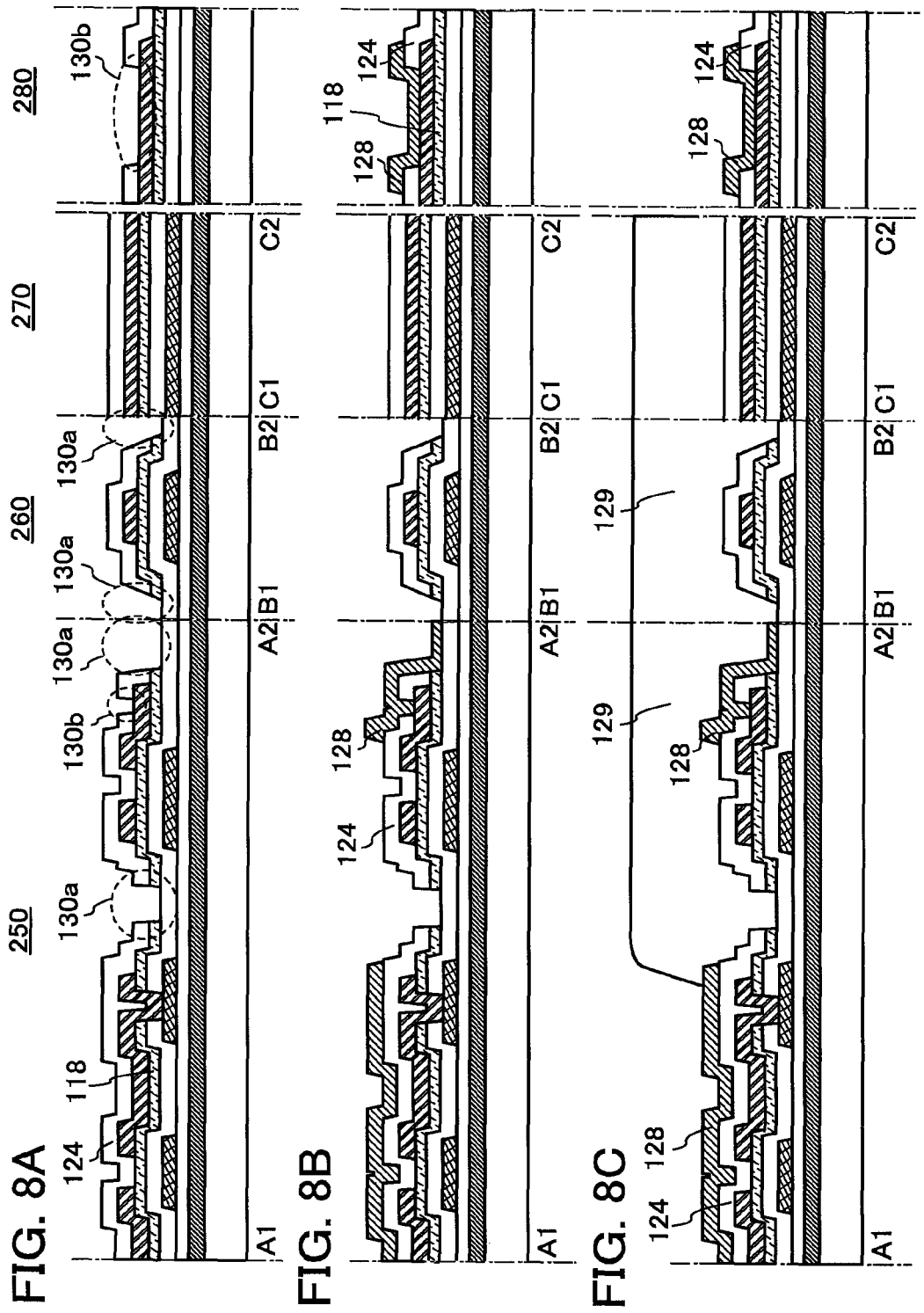

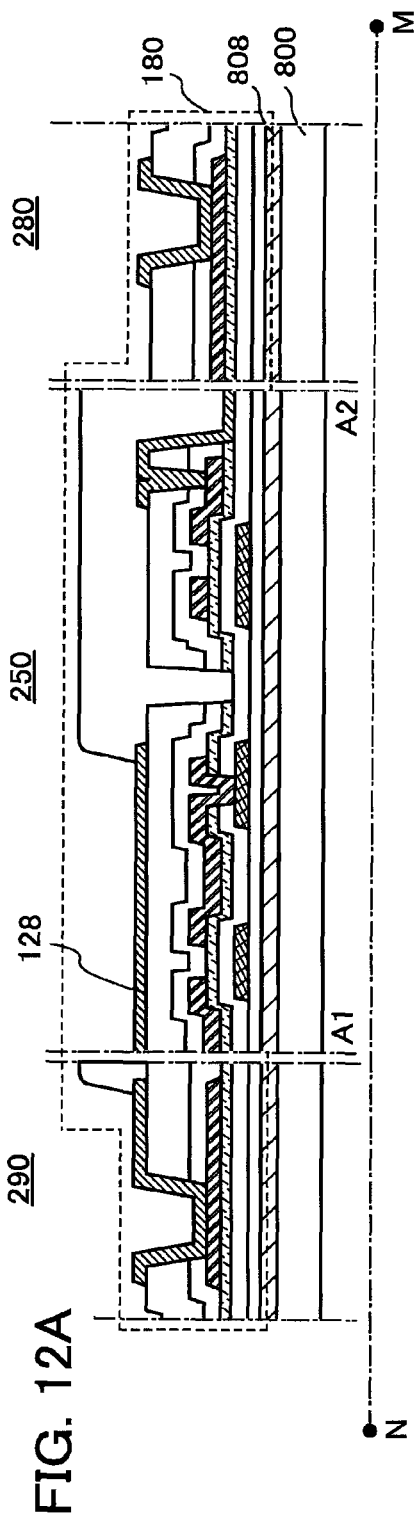
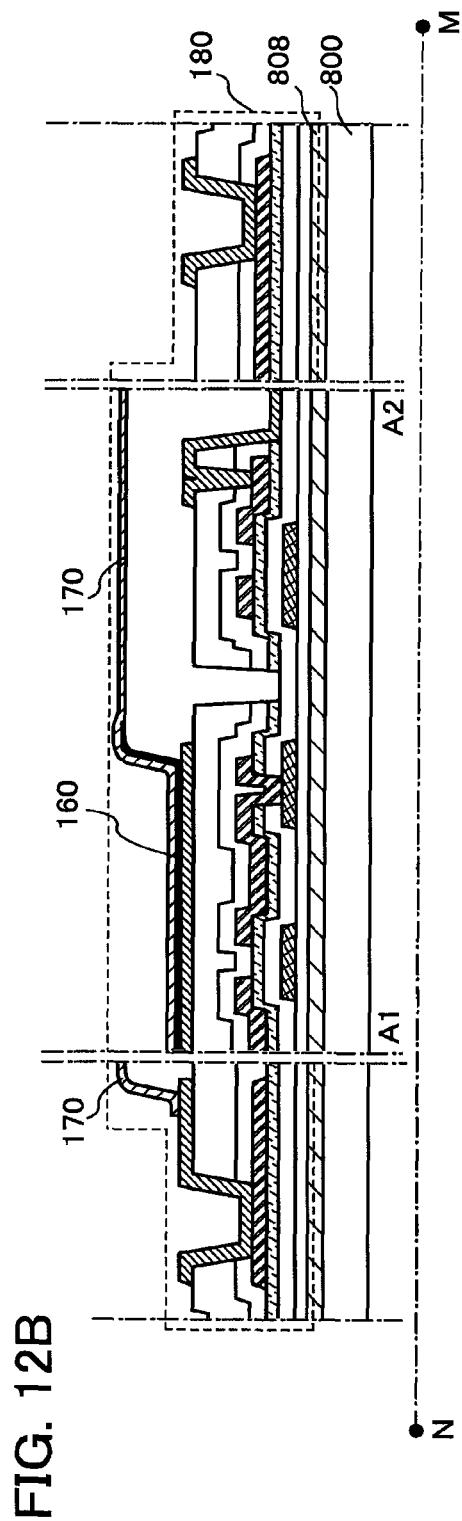
FIG. 12A
FIG. 12B

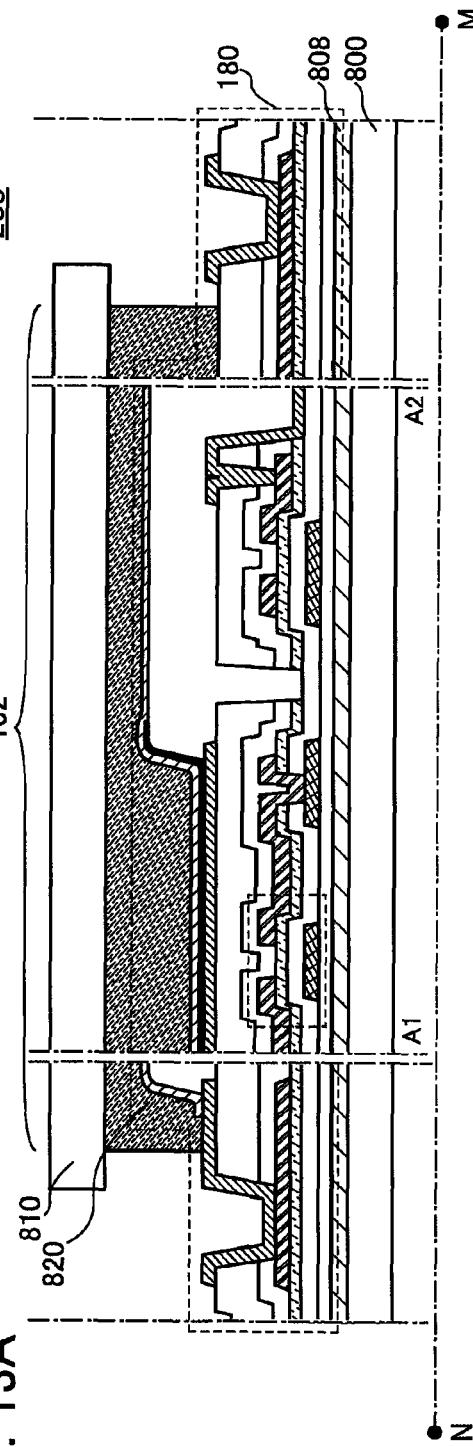
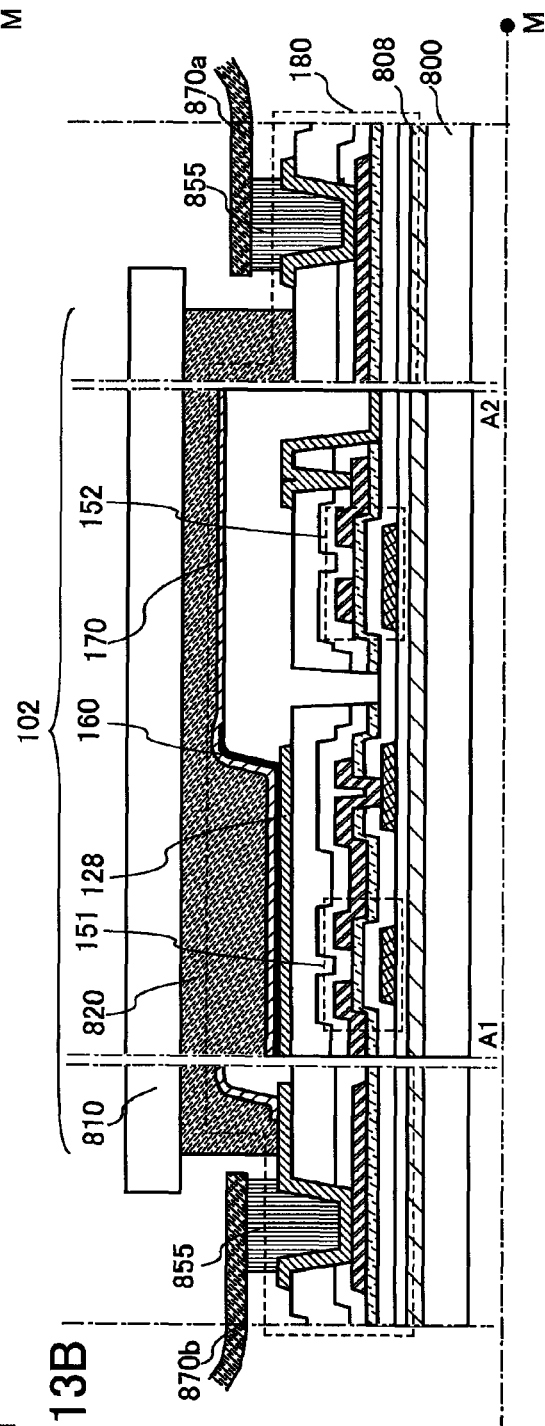
FIG. 13A
FIG. 13B

LIGHT-EMITTING DISPLAY DEVICE AND METHOD FOR MANUFACTURING THE SAME

BACKGROUND OF THE INVENTION

1. Field of the Invention

The present invention relates to a method for manufacturing a light-emitting display device including a thin film transistor.

2. Description of the Related Art

In recent years, reduction in cost, thickness, and weight of light-emitting display devices has been greatly needed.

Driving methods of light-emitting display devices are broadly classified into a passive matrix method and an active matrix method. Active matrix light-emitting display devices which are excellent in image quality and high-speed response have been in the mainstream.

The range of application of the active matrix light-emitting display devices has been expanding, and demands for larger screen size, higher definition, and higher aperture ratio have been increasing. In addition, it is demanded that the active matrix light-emitting display devices have high reliability and that a production method of the active matrix light-emitting display devices offer high yield at reduced cost. Simplification of a process is one way for increasing productivity and reducing manufacturing cost.

In an active matrix light-emitting display device, each pixel is provided with a switching element. As the switching element, a thin film transistor is mainly used. As such a thin film transistor, a top-gate transistor whose channel formation region is provided below a gate electrode and a bottom-gate transistor whose channel formation region is provided over a gate electrode are given. These thin film transistors are generally manufactured using at least five photomasks.

Reducing the number of photomasks as much as possible is one of important factors to manufacture light-emitting display devices at lower cost. In order to reduce the number of photomasks, a complicated technique such as backside light exposure (for example, see Patent Document 1), resist reflow, or a lift-off method, which requires a special apparatus, is used in many cases. The use of such a complicated technique might lead to various problems such as reduction in yield of light-emitting display devices and degradation of electric characteristics of thin film transistors.

Further, as one of methods for achieving reduction in thickness and weight of light-emitting display devices, reducing the thicknesses of substrates between which a light-emitting material is sandwiched, by mechanical polishing, chemical polishing, or the like, are given.

Mainly, glass substrates are used as substrates between which a light-emitting material is sandwiched and thus, there is a limit on reduction in thicknesses of such substrates by mechanical polishing, chemical polishing, or the like. Moreover, there is a problem that as the thicknesses of such substrates are reduced, the strength of the substrates is lowered and a light-emitting display device is more likely to be damaged by external impact. Therefore, it is ideal to manufacture a light-emitting display device with the use of significantly tough supports (such as a resin film and a metal film) as substrates between which a light-emitting material is sandwiched.

REFERENCE

[Patent Document 1] Japanese Published Patent Application No. H05-203987

SUMMARY OF THE INVENTION

The present invention is made in view of the foregoing technical background. Thus, an object of one embodiment of the present invention is to reduce the number of photomasks as compared to that in the conventional case, without a complicated technique or a special apparatus. Another object of one embodiment of the present invention is to provide a method for manufacturing a light-emitting display device which is thin, lightweight, and less prone to fracture.

An embodiment of the present invention is a method for manufacturing a light-emitting display device, which includes the steps of: forming a separation layer over a substrate; forming a first conductive layer over the separation layer; forming a first resist mask over the first conductive layer; partly removing the first conductive layer with the use of the first resist mask to form a first gate electrode and a second gate electrode; forming a first insulating layer to be a gate insulating layer over the first gate electrode and the second gate electrode; forming a semiconductor layer over the first insulating layer; forming a second resist mask over the semiconductor layer; selectively removing part of the semiconductor layer and part of the first insulating layer, which overlap with the second gate electrode, with the use of the second resist mask to form a first opening; forming a second conductive layer such that the second conductive layer covers the semiconductor layer and the first opening; forming a third resist mask over the second conductive layer; partly removing the second conductive layer with the use of the third resist mask to form first source and drain electrodes and second source and drain electrodes, so that a first transistor including the first gate electrode, the first source electrode, and the first drain electrode and a second transistor including the second gate electrode, the second source electrode, and the second drain electrode are manufactured, in which the first drain electrode and the second gate electrode are electrically connected to each other through the first opening; forming a second insulating layer serving as a protective insulating layer over the first source and drain electrodes, the second source and drain electrodes, and the semiconductor layer; forming a fourth resist mask over the second insulating layer; removing part of the second insulating layer and part of the semiconductor layer, which do not overlap with the first source and drain electrodes and the second source and drain electrodes, with the use of the fourth resist mask, to form a second opening and at the same time, removing part of the second insulating layer, which overlaps with the second drain electrode, with the use of the fourth resist mask, to form a third opening; forming a third conductive layer over the second insulating layer such that the third conductive layer covers the third opening; forming a fifth resist mask over the third conductive layer; partly removing the third conductive layer with the use of the fifth resist mask to form a first pixel electrode; and forming a fourth insulating layer such that the fourth insulating layer covers the second opening, the third opening, the second insulating layer, and an end portion of the first pixel electrode.

According to the above-described embodiment of the present invention, the step of forming the second opening serving as a contact hole and the step of etching the semiconductor layer to form the third opening are performed at the same time, whereby the thin film transistor can be manufactured using a smaller number of photomasks than those used in the conventional case and further, the thin film transistor can be separated from the substrate.

One embodiment of the present invention is a method for manufacturing a light-emitting display device, which includes the steps of: forming a separation layer over a substrate; forming a first conductive layer over the separation layer; forming a first resist mask over the first conductive layer; partly removing the first conductive layer with the use of the first resist mask to form a first gate electrode and a second gate electrode; forming a first insulating layer to be a gate insulating layer over the first gate electrode and the second gate electrode; forming a semiconductor layer over the first insulating layer; forming a second resist mask over the semiconductor layer; selectively removing part of the semiconductor layer and part of the first insulating layer, which overlap with the second gate electrode, with the use of the second resist mask to form a first opening; forming a second conductive layer such that the second conductive layer covers the semiconductor layer and the first opening; forming a third resist mask over the second conductive layer; partly removing the second conductive layer with the use of the third resist mask to form first source and drain electrodes and second source and drain electrodes, so that a first transistor including the first gate electrode, the first source electrode, and the first drain electrode and a second transistor including the second gate electrode, the second source electrode, and the second drain electrode are manufactured, in which the first drain electrode and the second gate electrode are electrically connected to each other through the first opening; forming a second insulating layer serving as a protective insulating layer over the first source and drain electrodes, the second source and drain electrodes, and the semiconductor layer; forming a third insulating layer serving as a planarization insulating layer over the second insulating layer; forming a fourth resist mask over the third insulating layer; removing part of the third insulating layer, part of the second insulating layer, and part of the semiconductor layer, which do not overlap with the first source and drain electrodes and the second source and drain electrodes, with the use of the fourth resist mask, to form a second opening and at the same time, selectively removing part of the third insulating layer and part of the second insulating layer, which overlaps with the second drain electrode, with the use of the fourth resist mask, to form a third opening; forming a third conductive layer over the third insulating layer such that the third conductive layer covers the third opening; forming a fifth resist mask over the third conductive layer; partly etching the third conductive layer with the use of the fifth resist mask to form a first pixel electrode; and forming a fourth insulating layer such that the fourth insulating layer covers the second opening, the third opening, and an end portion of the first pixel electrode.

According to the above-described embodiment of the present invention, the third insulating layer serving as a protective insulating layer is formed over the second insulating layer serving as a planarization insulating layer, whereby formation of unevenness of a surface of the first pixel electrode can be suppressed. Accordingly, the thickness of a light-emitting material can be kept uniform when the light-emitting material is deposited over the first pixel electrode. Therefore, a light-emitting display device having a light-emitting surface without emission unevenness can be manufactured.

In a method for manufacturing a light-emitting display device, according to one embodiment of the present invention, a base layer is formed between a substrate and a gate electrode.

According to the above-described embodiment of the present invention, diffusion of an impurity element from the substrate can be suppressed. Accordingly, a change in characteristics of a thin film transistor due to diffusion of an impurity element to a semiconductor layer can be suppressed.

In a method for manufacturing a light-emitting display device, according to one embodiment of the present invention, a semiconductor layer is an oxide semiconductor.

According to the above-described embodiment of the above-described present invention, a highly reliable light-emitting display device with low power consumption can be realized by using an oxide semiconductor as a semiconductor layer.

In a method for manufacturing a light-emitting display device, according to one embodiment of the present invention, heat treatment is performed on an oxide semiconductor.

According to the above-described embodiment of the present invention, the concentration of impurities such as moisture and hydrogen serving as electron donors (donors) of a semiconductor layer can be sufficiently reduced. Accordingly, the off-state current of a transistor can be reduced.

As to an oxide semiconductor highly purified by reducing impurities such as moisture and hydrogen serving as electron donors (donors) (purified OS), the hydrogen concentration measured by secondary ion mass spectrometry (SIMS) is $5 \times 10^{19}/cm^3$ or less, preferably $5 \times 10^{18}/cm^3$ or less, more preferably $5 \times 10^{17}/cm^3$ or less, and still more preferably $1 \times 10^{16}/cm^3$ or less. Furthermore, the band gap of the oxide semiconductor is 2 eV or more, preferably 2.5 eV or more, more preferably 3 eV or more.

The SIMS analysis of the hydrogen concentration in the oxide semiconductor is described here. Because of the principle of the SIMS analysis, it is known to be difficult to obtain accurate data in the proximity of a surface of a sample or in the proximity of an interface between stacked films formed of different materials. Therefore, when a hydrogen concentration of the film is analyzed by SIMS, the average value in a region in which the values do not extremely vary and are substantially constant is employed as the hydrogen concentration. Further, in the case where the thickness of the film is small, a region where a constant value can be obtained cannot be found in some cases due to the influence of the hydrogen in the films adjacent to each other. In this case, the maximum value or the minimum value of the hydrogen concentration is employed as the hydrogen concentration in the film. Furthermore, in the case where a maximum peak and a minimum valley do not exist, the value of the inflection point is employed as the hydrogen concentration.

In a method for manufacturing a light-emitting display device, according to one embodiment of the present invention, a first conductive layer and a second conductive layer are each formed using a material containing copper.

According to the above-described embodiment of the present invention, the use of a material containing copper for formation of a gate electrode, a source electrode, a drain electrode, or a wiring connected to these electrodes allows reduction in wiring resistance, so that signal delay can be prevented.

In a method for manufacturing a light-emitting display device, according to one embodiment of the present invention, the upper limit of the process temperature at the time after formation of a first conductive layer and a second conductive layer is lower than or equal to 450° C.

According to the above-described embodiment of the present invention, when a material containing copper is used for formation of a gate electrode, a source electrode, a drain electrode, or a wiring connected to these electrodes, the electrodes and the wiring are not deformed, and elution of a component in the electrodes and the wiring due to a thermal factor does not occur. Therefore, a highly reliable light-emitting display device can be manufactured.

In a method for manufacturing a light-emitting display device, according to one embodiment of the present invention, a first conductive layer and a second conductive layer are each formed using a material containing aluminum.

According to the above-described embodiment of the present invention, the use of a material containing aluminum for formation of a gate electrode, a source electrode, a drain electrode, or a wiring connected to these electrodes allows reduction in wiring resistance, so that signal delay can be prevented.

In a method for manufacturing a light-emitting display device, according to one embodiment of the present invention, the upper limit of the process temperature at the time after formation of a first conductive layer and a second conductive layer is lower than or equal to 380° C.

According to the above-described embodiment of the present invention, when a material containing aluminum is used for formation of a gate electrode, a source electrode, a drain electrode, or a wiring connected to these electrodes, the electrode and the wiring are not deformed, and elution of a component in the electrodes and the wiring due to a thermal factor does not occur. Therefore, a highly reliable light-emitting display device can be manufactured.

A method for manufacturing a light-emitting display device, according to one embodiment of the present invention, includes: a step of forming an element region including at least a first gate electrode, a second gate electrode, a first insulating layer, a semiconductor layer, a first source electrode, a first drain electrode, a second source electrode, a second drain electrode, a second insulating layer, a fourth insulating layer, and a first pixel electrode, over a substrate with a separation layer interposed therebetween, which is followed by a step of forming an adhesive for separation such that the adhesive for separation covers a surface of the element region; a step of separating the first pixel electrode and the element region from the substrate; a step of bonding a first support whose fracture toughness is greater than or equal to 1.5 [MPa·m$^{1/2}$] to the other surface of the element region; a step of removing the adhesive for separation from the first support; a step of forming a layer containing an organic compound selectively over the first pixel electrode formed in the element region; a step of forming a second pixel electrode such that the second pixel electrode covers the layer containing an organic compound; and a step of bonding a second support whose fracture toughness is greater than or equal to 1.5 [MPa·m$^{1/2}$] such that the second support covers the second pixel electrode.

According to the above-described embodiment of the present invention, the element region provided over the substrate can be transferred to the first support whose fracture toughness is greater than or equal to 1.5 [MPa·m$^{1/2}$]. Further, the second support with which a light-emitting material is sandwiched also has a fracture toughness of greater than or equal to 1.5 [MPa·m$^{1/2}$]. Thus, a light-emitting display device which is thin, lightweight, and less prone to fracture can be manufactured.

A semiconductor device in this specification refers to any device that can function by utilizing semiconductor characteristics. A semiconductor circuit, a storage device, an imaging device, a display device, an electro-optical device, an electronic device, and the like are all semiconductor devices.

When "B is formed on A" or "B is formed over A" is explicitly described in this specification, it does not necessarily mean that B is formed in direct contact with A. The expression includes the case where A and B are not in direct contact with each other, i.e., the case where another object is interposed between A and B. Here, each of A and B corresponds to an object (e.g., a device, an element, a circuit, a wiring, an electrode, a terminal, a film, a layer, or a substrate).

Therefore, for example, when it is explicitly described that a layer B is formed on or over a layer A, it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., the layer C or the layer D) may be a single layer or a plurality of layers.

In this specification, ordinal numbers such as "first", "second", and "third" are used in order to avoid confusion among components, and the terms do not mean the number of components.

A "transistor" in this specification is a kind of semiconductor elements and can perform amplification of current or voltage, switching operation for controlling conduction or non-conduction, or the like. A "transistor" in this specification includes an insulated-gate field effect transistor (IGFET) and a thin film transistor (TFT).

Functions of a "source" and a "drain" of a transistor in this specification are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification, the term of "electrode" or "wiring" does not limit the function of component. For example, an "electrode" is sometimes used as part of a "wiring", and vice versa. Furthermore, the term "electrode" or "wiring" can include the case where a plurality of "electrodes" or "wirings" is formed in an integrated manner.

The term "toughness" in this specification represents the resistance of a material to fracture. The fracture is less prone to progress even in the case where a heavy load is applied or strong impact is made as a material has higher toughness, and the fracture is less prone to progress when a flaw produced in part of a substrate acts as a starting point, for example. The level of the toughness can be expressed in the fracture toughness Kc. Note that the fracture toughness Kc can be determined by a test method defined in JIS R1607.

According to one embodiment of the present invention, the number of photomasks can be reduced as compared to the conventional case without using a complicated technique or a special apparatus. Further, a method for manufacturing a light-emitting display device which is thin, lightweight, and significantly tough can be provided.

BRIEF DESCRIPTION OF THE DRAWINGS

In the accompanying drawings:

FIGS. 6A to 6C are cross-sectional views illustrating a method for manufacturing a light-emitting display device, according to the one embodiment;

FIGS. 8A to 8C are cross-sectional views illustrating a method for manufacturing a light-emitting display device, according to one embodiment;

FIGS. 12A and 12B are cross-sectional views illustrating a method for manufacturing a light-emitting display device, according to the one embodiment;

FIGS. 13A and 13B are cross-sectional views illustrating a method for manufacturing a light-emitting display device, according to the one embodiment;

DETAILED DESCRIPTION OF THE INVENTION

Figure 1A:
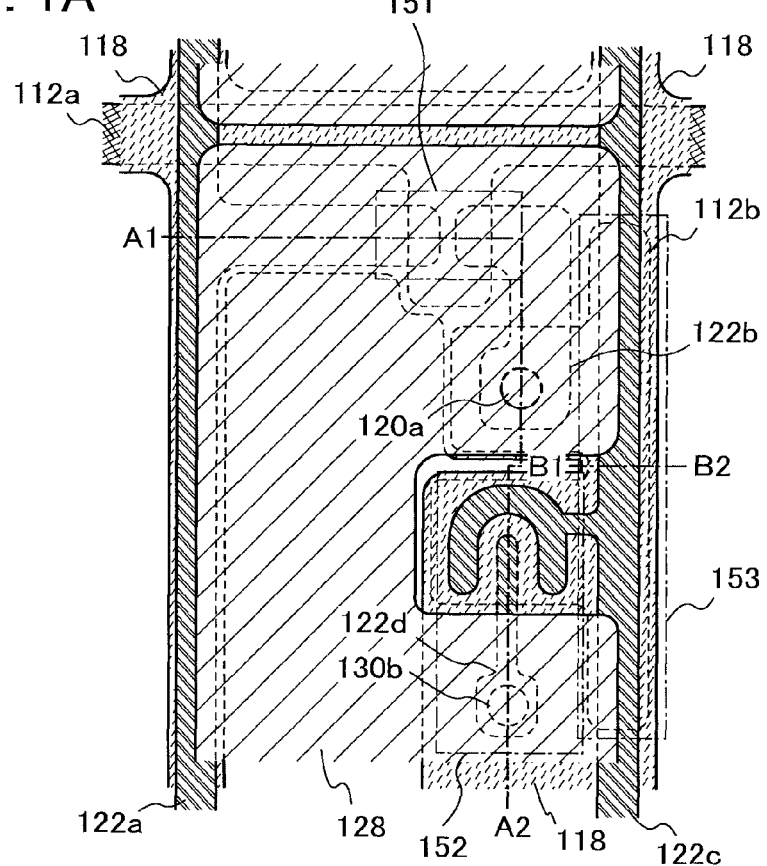
FIGS. 1A and 1B are a plan view and a cross-sectional view illustrating a light-emitting display device according to one embodiment.

Embodiments will be described in detail with reference to the drawings. Note that the present invention is not limited to the following description, and it is easily understood by those skilled in the art that modes and details of the present invention can be modified in a variety of ways without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a structural example of a pixel portion included in a light-emitting display device according to one embodiment of the present invention will be described with reference to FIGS. 1A and 1B, FIG. 2, FIG. 3, and FIGS. 4A and 4B. Note that description will be made in this embodiment assuming that the structure of the pixel portion is a top emission structure; however, an embodiment of the present invention is not limited thereto. As general emission structures other than a top emission structure, a bottom emission structure, a dual emission structure, and the like are given. Since those skilled in the art know these structures well, specific description of such emission structures is omitted in this embodiment.

Figure 3:
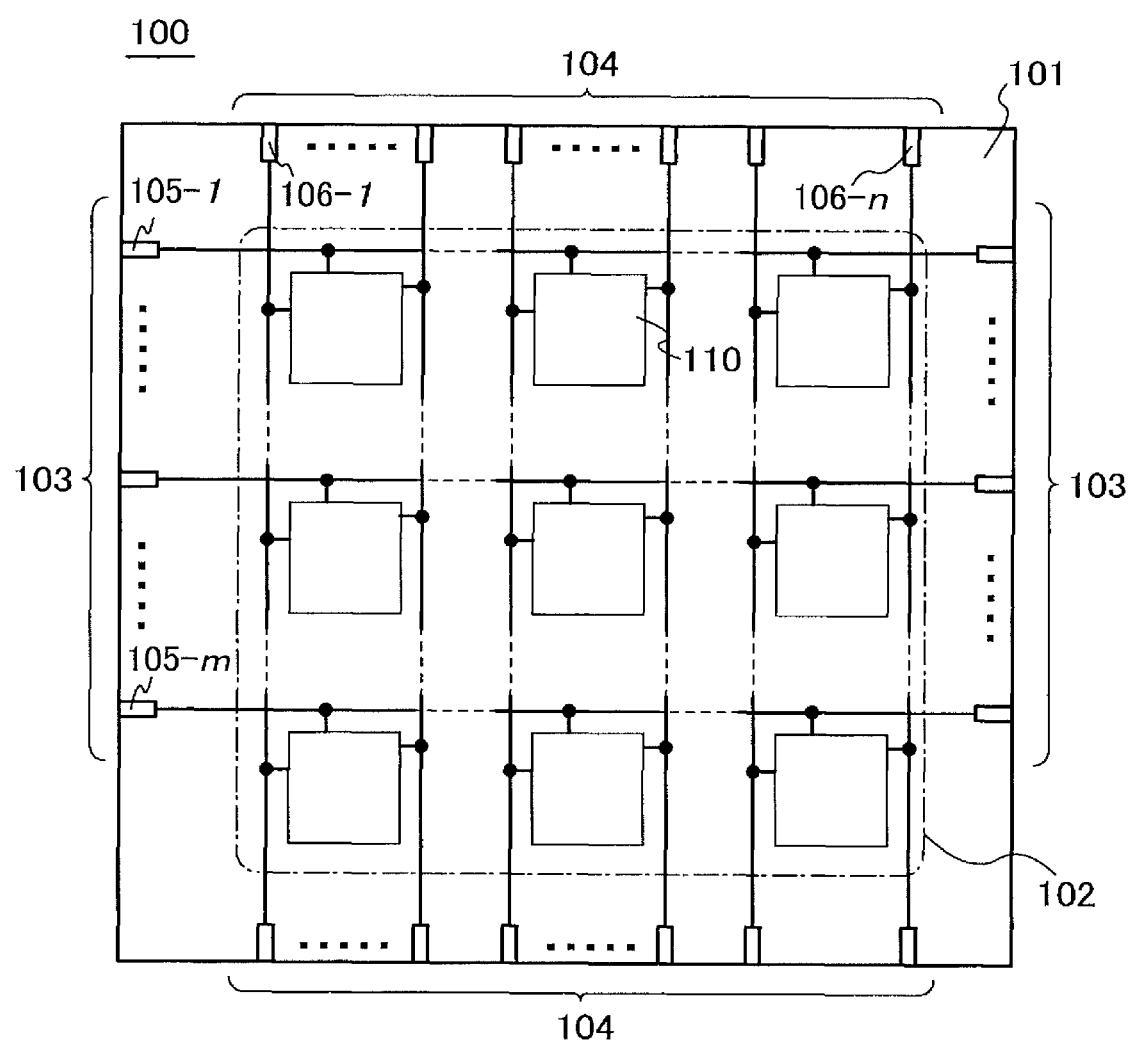
FIG. 3 is a circuit diagram illustrating one embodiment of the present invention.

FIG. 3 shows a structure example of a semiconductor device 100 used in a light-emitting display device. The semiconductor device 100 includes, over a substrate 101, a pixel region 102 provided with a plurality of pixels 110, a terminal portion 103 including in (in is an integer greater than or equal to 1) terminals 105, and a terminal portion 104 including n (n is an integer greater than or equal to 1) terminals 106.

The terminal portion 103 and the terminal portion 104 are terminals connected to external wirings and are connected to a control circuit provided externally through the external wirings. Signals supplied from the control circuit provided externally are input to the semiconductor device 100 through the terminal portions 103 and the terminal portions 104. In FIG. 3, the terminal portions 103 are provided on the right external side and the left external side of the pixel region 102, and signals are input from the two portions. The terminal portions 104 are provided on the upper external side and the lower external side of the pixel region 102, and signals are input from the two portions. The signal supply capability is increased by the input of signals from the two portions; thus, high-speed operation of the semiconductor device 100 can be easily achieved. Moreover, the influence of signal delay due to increase in wiring resistance, which is caused by increase in size or in definition of the semiconductor device 100, can be reduced. Further, the semiconductor device 100 can have redundancy, so that the reliability of the semiconductor device 100 can be increased. Note that although FIG. 3 shows the structure in which two terminal portions 103 and two terminal portions 104 are provided, a structure may be employed in which one terminal portion 103 and one terminal portion 104 are provided.

Figure 4A:
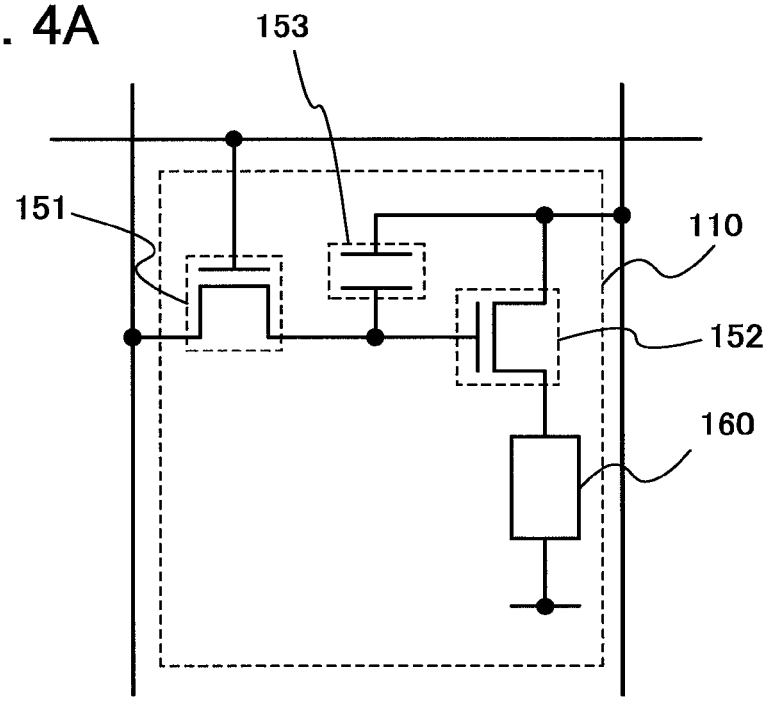
FIGS. 4A and 4B are circuit diagrams each illustrating one embodiment of the present invention.
Figure 4B:
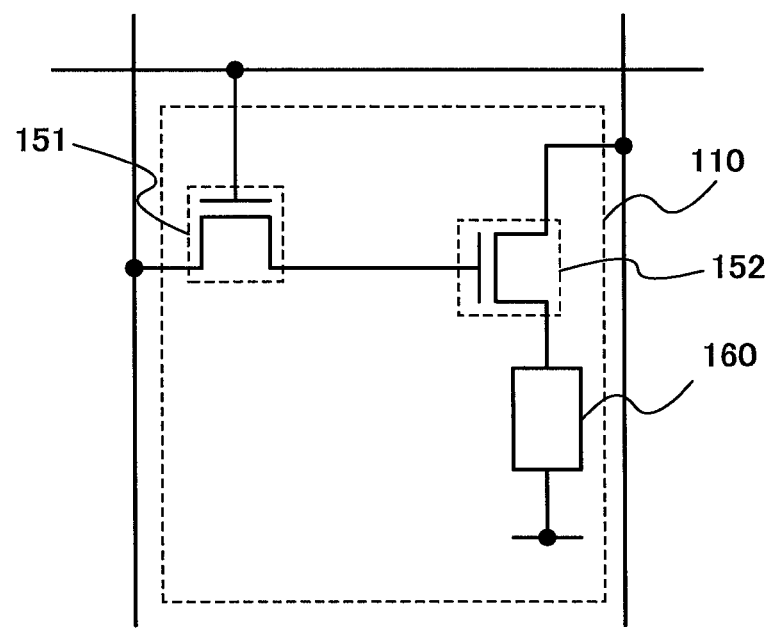

FIG. 4A illustrates a circuit configuration of the pixel 110. The pixel 110 includes a first transistor 151, a second transistor 152, a light-emitting element 160, and a capacitor 153. Although not illustrated, the light-emitting element 160 is connected to an external connection terminal. The capacitance of the capacitor 153 provided in a light-emitting display device is set in consideration of leakage current or the like of transistors provided in a pixel portion so that charge can be held for a predetermined period. When the transistor having a highly purified oxide semiconductor for a semiconductor layer in which a channel region is formed is used, the storage capacitance of the capacitor 153 can be reduced. FIG. 4B is a circuit configuration without the capacitor 153 in FIG. 4A.

A single crystal semiconductor, a polycrystalline semiconductor, a microcrystalline semiconductor, an amorphous semiconductor, or the like can be used as a semiconductor for forming channels of the first transistor 151 and the second transistor 152. Examples of a semiconductor material include silicon, germanium, silicon germanium, silicon carbide, and gallium arsenide.

Alternatively, an oxide semiconductor may be used as a semiconductor layer for forming the channels of the first transistor 151 and the second transistor 152. The oxide semiconductor may be either a single crystal oxide semiconductor or a non-single-crystal oxide semiconductor. In the latter case, the non-single-crystal oxide semiconductor may be amorphous, microcrystalline (nanocrytalline), or polycrystalline. Further, the oxide semiconductor may have either an amorphous structure including a portion having crystallinity or a non-amorphous structure without a portion having crystallinity. An amorphous oxide semiconductor can be formed by sputtering with the use of an oxide semiconductor target. A crystalline oxide semiconductor can be formed while a substrate is heated to a temperature higher than or equal to room temperature in sputtering. Further, as the oxide semiconductor, an oxide semiconductor whose crystallographic axes are aligned can be used as described in Embodiment 2. In this embodiment, an oxide semiconductor whose carrier concentration is extremely reduced (also referred to as an i-type (intrinsic) or substantially i-type oxide semiconductor) is used as a semiconductor layer.

An oxide semiconductor has a wide energy gap of 3.0 eV or more. In a transistor having an oxide semiconductor prepared under appropriate conditions, the off-state current can be lower than or equal to 100 zA ($1 \times 10^{-19}$ A), further, lower than or equal to 10 zA ($1 \times 10^{-20}$ A), furthermore, lower than or equal to 1 zA ($1 \times 10^{-21}$ A) at an operating temperature (e.g., at 25° C.).

Thus, the use of an oxide semiconductor for a semiconductor layer of the first transistor 151 and the second transistor 152 in which channels are formed allows the reduction of the current value in an off state (off-state current value). Accordingly, the retention time of an electric signal such as an image signal can be increased, and the signal can be held for a long time even if additional writing is not carried out. Therefore, the frequency of refresh operation can be reduced, which contributes to the reduction of power consumption. Further, when a transistor in which an oxide semiconductor is used for a semiconductor layer is used for the first transistor 151 and the second transistor 152, a potential supplied to a light-emitting element can be held even without a storage capacitor.

The transistor where an oxide semiconductor is used for a semiconductor layer in which a channel is formed has a relatively high field-effect mobility, so that high-speed operation is possible. Therefore, by using such a transistor in a pixel portion of a light-emitting display device, a high-quality image can be provided. In addition, since such a transistor can be provided in each of a driver circuit portion and a pixel portion which are provided over one substrate, the number of components of a light-emitting display device can be reduced.

Figure 1B:
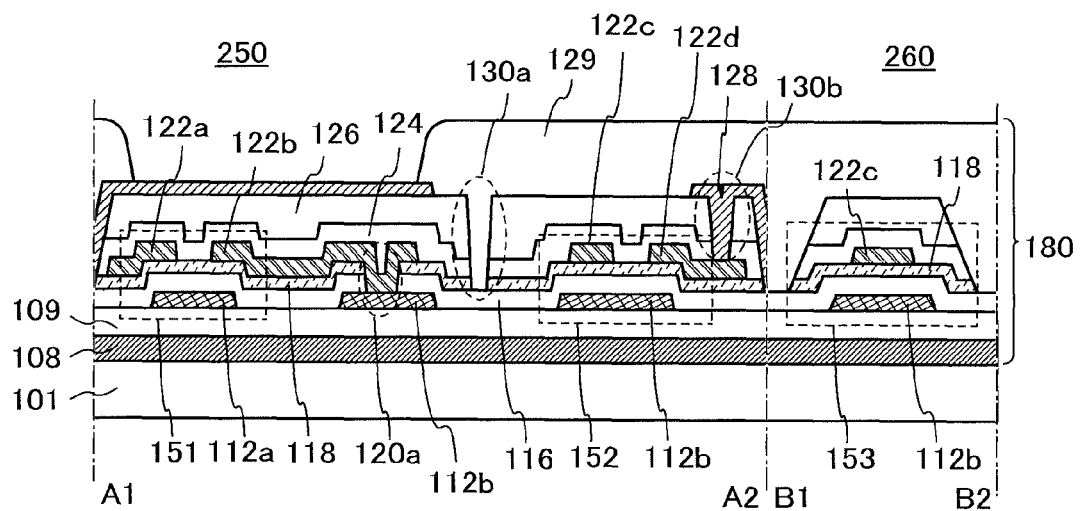

FIGS. 1A and 1B are an example of a pixel portion of an active matrix light-emitting display device according to one embodiment of the present invention. FIG. 1A is a plan view illustrating the pixel portion of the light-emitting display device, and FIG. 1B is a cross-sectional view illustrating a layered structure of the pixel portion. Note that dashed-dotted lines A1-A2 and B1-B2 in FIG. 1A correspond to cross sections A1-A2 and B1-B2, respectively. Note that a light-emitting layer and a second pixel electrode (also referred to as a common electrode) are not illustrated in FIGS. 1A and 1B.

In this embodiment, a structure and a manufacturing method of the pixel portion in the light-emitting display device will be described. Thus, a transistor in this embodiment refers to one of or both the first transistor 151 and the second transistor 152 which are illustrated in FIGS. 1A and 1B. The transistor is an n-channel transistor including an oxide semiconductor to be described later.

In the transistor 152 described in this embodiment, a second drain electrode 122d is partly surrounded by a U-shaped (C-shaped, reversed C-shaped, or horseshoe-shaped) second source electrode 122c. With the second source electrode having such a shape, a channel width can be sufficiently secured even when the area of a transistor is small; thus, the amount of current flowing while the transistor is in an on state (also referred to as on-state current) can be increased.

In the cross section A1-A2 of FIG. 1B, layered structures of the first transistor 151 and the second transistor 152 are illustrated. The first transistor 151 and the second transistor 152 are bottom-gate transistors. In the cross section B1-B2 of FIG. 1B, a layered structure of the capacitor 153 is illustrated.

In the cross section A1-A2, a separation layer 108 is formed over the substrate 101, a base layer 109 is formed over the separation layer 108, and a first gate electrode 112a and a second gate electrode 112b are formed over the base layer 109. Over the first gate electrode 112a and the second gate electrode 112b, a semiconductor layer 118 and a first insulating layer 116 serving as gate insulating layers are formed. Further, a first source electrode 122a, a first drain electrode 122b, the second source electrode 122c, and the second drain electrode 122d are formed over the semiconductor layer 118.

Accordingly, the first transistor 151 including the first gate electrode 112a, the first source electrode 122a, and the first drain electrode 122b, and the second transistor 152 including the second gate electrode 112b, the second source electrode 122c, and the second drain electrode 122d are formed. Note that the first drain electrode 122b is connected to the second gate electrode 112b through the first opening 120a.

A second insulating layer 124 serving as a protective insulating layer and a third insulating layer 126 serving as a planarization insulating layer are formed over the first transistor 151 and the second transistor 152. Part of the second insulating layer 124 and part of the third insulating layer 126 are removed to form a second opening 130a and a third opening 130b. In the second opening 130a, part of the first insulating layer 116 is exposed. In the third opening 130b, part of the second drain electrode 122d is exposed. Note that the third insulating layer 126 is may be omitted.

Further, a first pixel electrode 128 is formed so as to cover the third opening 130b, so that the second drain electrode 122d and the first pixel electrode 128 are electrically connected to each other through the third opening 130b. After that, a partition wall 129 is formed using an insulating material over the third insulating layer 126 so as to cover an end portion of the first pixel electrode 128. Here, the partition wall 129 is formed so as to cover a region having unevenness such as an end portion of the first pixel electrode 128, or the like. The partition wall 129 makes it possible to prevent disconnection of a light-emitting layer or a second pixel electrode to be formed over the first pixel electrode 128 or the like later.

In the cross section B1-B2, the separation layer 108 is formed over the substrate 101, the base layer 109 is formed over the separation layer 108, and a second gate electrode 112b functioning as a capacitor wiring is formed over the base layer 109. The first insulating layer 116 and the semiconductor layer 118 are faulted over the second gate electrode 112b functioning as a capacitor wiring, and the second source electrode 122c functioning as a capacitor wiring is formed over the semiconductor layer 118. Further, over the second source electrode 122c functioning as a capacitor wiring, the second insulating layer 124 and the third insulating layer 126 are formed.

A portion where the second gate electrode 112b and the second source electrode 122c overlap with each other with the first insulating layer 116 and the semiconductor layer 118 interposed therebetween functions as the capacitor 153. The first insulating layer 116 and the semiconductor layer 118 function as dielectric layers. Since the dielectric layers formed between the second gate electrode 112b and the second source electrode 122c has a multi-layer structure, even when a pinhole is formed in one dielectric layer, the pinhole is covered with the other dielectric layer; thus, the capacitor 153 can function normally. Further, the relative dielectric constant of an oxide semiconductor is as high as 14 to 16; thus, the capacitance of the capacitor 153 can be large when an oxide semiconductor is used for the semiconductor layer 118.

Note that although the first transistor 151 has a single-gate structure in FIGS. 1A and 1B, a multi-gate structure may be employed. A multi-gate transistor whose off-state current is low enables display characteristics of the light-emitting display device including the transistor to be improved.

Note that in FIG. 1B, the layers formed over the separation layer 108 are hereinafter collectively referred to as an element region 180. The element region 180 includes at least the first gate electrode 112a, the second gate electrode 112b, the first insulating layer 116, the semiconductor layer 118, the first source electrode 122a, the first drain electrode 122b, the second source electrode 122c, the second drain electrode 122d, the second insulating layer 124, the first pixel electrode 128, and a partition wall 129. The element region 180 may further include the base layer 109, the third insulating layer 126, and the like.

Figure 2:
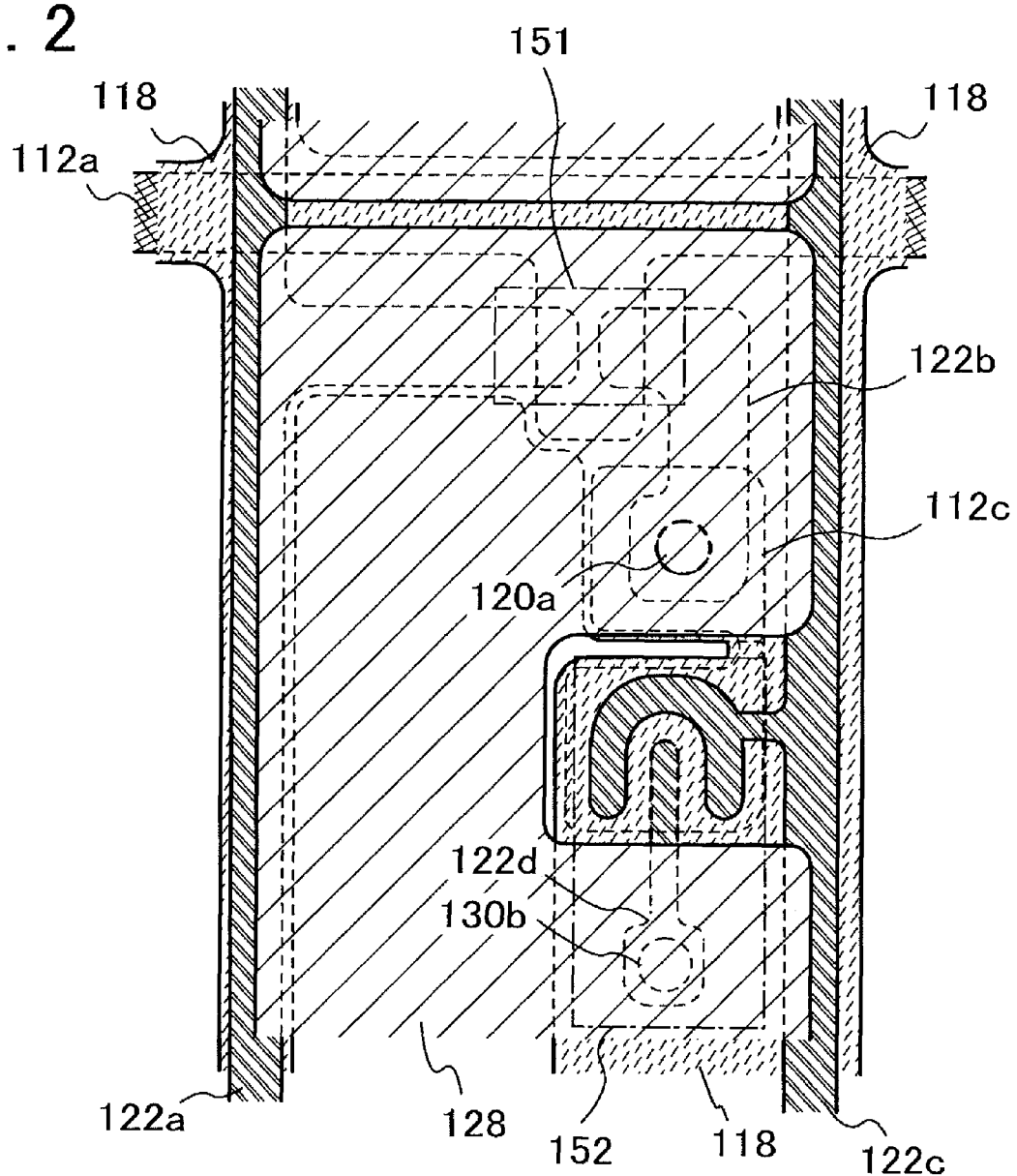
FIG. 2 is a plan view illustrating a light-emitting display device according to one embodiment.

A structure without the capacitor 153, which is illustrated in FIG. 2, may alternatively be employed. In FIG. 2, a second gate electrode 112c which corresponds to the second gate electrode 112b of FIG. 1B does not overlap with a power supply wiring (the second source electrode 122c in FIG. 1B), whereby a capacitor is not formed. FIG. 4B is a circuit diagram of this structure.

Subsequently, an example of a manufacturing method of the pixel portion of the light-emitting display device described with reference to FIGS. 1A and 1B will be described with reference to FIGS. 5A to 5C, FIGS. 6A to 6C, FIGS. 7A and 7B, and FIGS. 8A to 8C. Note that a manufacturing method of a transistor portion 250 will be mainly described here. A capacitor portion 260, a wiring intersection portion 270, and a first external wiring connection portion 280 which are illustrated in the drawings will be described as needed.

First, the separation layer 108 is formed over the substrate 101 to a thickness of greater than or equal to 50 nm and less than or equal to 1000 nm, preferably greater than or equal to 100 nm and less than or equal to 500 nm, more preferably greater than or equal to 100 nm and less than or equal to 300 nm.

The substrate 101 may be a glass substrate, a quartz substrate, a sapphire substrate, a ceramic substrate, a metal substrate, or the like. Note that such a substrate which is not thin enough to be definitely flexible enables precise formation of an element such as a transistor. "Not definitely flexible" means that the elastic modulus of the substrate is higher than or equivalent to that of a glass substrate used in generally fabricating a light-emitting display. In this embodiment, aluminoborosilicate glass is used for the substrate 101.

The separation layer 108 is formed to have a single-layer or layered structure using any of elements selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), an alloy containing any of the above elements as its main component, and a compound containing any of the above elements as its main component by a sputtering method, a plasma CVD method, an application method, a printing method, or the like.

When the separation layer 108 has a single-layer structure, a layer containing tungsten, molybdenum, or a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 108 has a layered structure, it is preferable that a metal layer and a metal oxide layer be formed as a first layer and a second layer, respectively. Typically, it is preferable to form a tungsten layer, a molybdenum layer, or a layer containing mixture of tungsten and molybdenum as the first layer and to form an oxide, a nitride, an oxynitride, or a nitride oxide of tungsten, molybdenum, or mixture of tungsten and molybdenum as the second layer. When the metal oxide layer is formed as the second layer, an oxide layer (such as a silicon oxide which can be utilized as an insulating layer) may be formed on the metal layer as the first layer so that an oxide of the metal is formed on a surface of the metal layer.

It is also possible to use an amorphous silicon layer containing hydrogen, a layer containing nitrogen, oxygen, hydrogen, or the like (e.g., an amorphous silicon film containing hydrogen, an alloy film containing hydrogen, or an alloy film containing oxygen), or an organic resin, as the separation layer 108.

In this embodiment, a tungsten film with a thickness of 150 nm is used as the separation layer 108. Note that the tungsten film may be in a state where a surface thereof is oxidized (that is, in a state where a tungsten oxide film is formed over the surface of the tungsten film).

The separation layer 108 is a layer mainly for separation of the element region 180 provided over the separation layer 108 from the substrate 101 and further has a function of preventing diffusion of an impurity element from the substrate 101.

Next, over the separation layer 108, an insulating layer to be the base layer 109 is formed to a thickness of greater than or equal to 50 nm and less than or equal to 300 nm, preferably greater than or equal to 100 nm and less than or equal to 200 nm.

The base layer 109 can be formed with a single-layer structure or a layered structure using at least one of the following insulating layers: an aluminum nitride layer, an aluminum oxynitride layer, a silicon nitride layer, a silicon oxide layer, a silicon nitride oxide layer, and a silicon oxynitride layer. The base layer 109 has a function of preventing diffusion of an impurity element from the substrate 101 and the separation layer 108. Note that silicon nitride oxide in this specification contains oxygen and nitrogen so that the nitrogen content is higher than the oxygen content. It is preferred that in the case where measurements are performed using RBS and HFS, silicon nitride oxide be estimated to have a composition of oxygen, nitrogen, silicon, and hydrogen at 5 at. % to 30 at. %, 20 at. % to 55 at. %, 25 at. % to 35 at. %, and 10 at. % to 30 at. %, respectively. The base layer 109 can be formed by a sputtering method, a CVD method, a coating method, a printing method, or the like as appropriate.

In this embodiment, a stack of a silicon nitride layer and a silicon oxide layer is used as the base layer 109. Specifically, a 50-nm-thick silicon nitride layer is formed over the substrate 101, and a 150-nm-thick silicon oxide layer is formed over the silicon nitride layer. Note that the base layer 109 may be doped with phosphorus (P) or boron (B).

When a halogen element such as chlorine or fluorine is contained in the base layer 109, a function of preventing diffusion of an impurity element from the substrate 101 can be further improved. The concentration of a halogen element contained in the base layer 109 is measured by secondary ion mass spectrometry (SIMS) and its peak is preferably greater than or equal to $1\times10^{15}/cm^3$ and less than or equal to $1\times10^{20}/cm^3$.

The base layer 109 may be formed using gallium oxide. Alternatively, the base layer 109 may have a layered structure of a gallium oxide layer and the above insulating layer. Gallium oxide is a material which is hardly charged; therefore, variation in threshold voltage due to charge buildup of the insulating layer can be suppressed.

Next, over the base layer 109, a first conductive layer is formed to a thickness of greater than or equal to 100 nm and less than or equal to 500 nm, preferably greater than or equal to 200 nm and less than or equal to 300 nm, by a sputtering method, a vacuum evaporation method, or a plating method. Then, a first resist mask is formed over the first conductive layer and the first conductive layer is partly etched using the first resist mask, whereby the first gate electrode 112a and the second gate electrode 112b are formed (see FIG. 5A).

The first conductive layer for forming the first gate electrode 112a and the second gate electrode 112b can be formed to have a single-layer structure or a layered structure using a metal material such as molybdenum (Mo), titanium (Ti), tungsten (W), tantalum (Ta), aluminum (Al), copper (Cu), chromium (Cr), neodymium (Nd), or scandium (Sc), or an alloy containing any of these elements as its main component. Alternatively, the first conductive layer may be formed using a conductive metal oxide. As the conductive metal oxide, indium oxide ($In_2O_3$), tin oxide ($SnO_2$), zinc oxide (ZnO), an indium oxide-tin oxide ($In_2O_3$—$SnO_2$, abbreviated to ITO), an indium oxide-zinc oxide ($In_2O_3$—ZnO), or any of these metal oxides containing silicon oxide can be used. Still alternatively, a conductive composition containing a conductive macromolecule (also referred to as a conductive polymer) can be used to form the first conductive layer. As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given. Alternatively, a material formed of 1 to 10 graphene sheets (corresponding to one layer of graphite) may be used.

In this embodiment, a top emission structure where light from the light-emitting element is emitted in the direction opposite to the substrate 101 (the upward direction in FIGS. 5A to 5C) is employed; thus, there is no particular limitation on the first conductive layer. On the other hand, in the case where a bottom emission structure or a dual emission structure is employed and the first gate electrode 112a and the second gate electrode 112b exist in a portion through which emitted light passes (that is, when emitted light is blocked by the first gate electrode 112a and the second gate electrode 112b), it is preferable to form a light-transmitting layer as the first conductive layer.

Since the first conductive layer serves as a wiring, a low resistance material such as Al or Cu is preferably used. With use of Al or Cu, signal delay is reduced, so that higher image quality can be obtained. Note that Al has low heat resistance, and thus a defect due to hillocks, whiskers, or migration is easily generated. To prevent migration of Al, a layer of a metal having a higher melting point than Al, such as Mo, Ti, or W, is preferably stacked over an Al layer, or an alloy layer of Al and an element which prevents hillocks, such as Nd, Ti, Si, or Cu, is preferably used. In the case where a material containing Al is used for the first conductive layer, the maximum process temperature in a later step is preferably set to 380° C. or lower, more preferably 350° C. or lower.

Also in the case where Cu is used for the first conductive layer, in order to prevent a defect due to migration and diffusion of a Cu element, a layer of a metal having a higher melting point than Cu, such as Mo, Ti, or W, is preferably stacked over the first conductive layer containing Cu. In the case where a material containing Cu is used for the first conductive layer, the maximum process temperature in a later step is preferably set to 450° C. or lower.

In this embodiment, as the first conductive layer, a 5-nm-thick Ti layer is formed over the base layer 109, and a 250-nm-thick Cu layer is formed over the Ti layer. After that, a first resist mask is formed over the first conductive layer and the first conductive layer is partly etched using the first resist mask, so that the first gate electrode 112a and the second gate electrode 112b are formed.

Note that the first resist mask formed over the first conductive layer may be formed by an inkjet method. Formation of the first resist mask by an inkjet method needs no photomask; thus, manufacturing cost can be reduced. The first resist mask is removed after the etching. Description of a process relating to the removal of the first resist mask is omitted.

Note that the etching of the first conductive layer may be either dry etching or wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be used.

For the dry etching, a parallel plate reactive ion etching (ME) method or an inductively coupled plasma (ICP) etching method can be used. The etching conditions are preferably set so that the base layer 109 is not etched as much as possible because the base layer 109 has a function of preventing diffusion of an impurity element from the substrate 101.

Then, the first insulating layer 116 serving as a gate insulating layer is formed to a thickness of greater than or equal to 50 nm and less than or equal to 800 nm, preferably greater than or equal to 100 nm and less than or equal to 600 nm over the first gate electrode 112a, the second gate electrode 112b, and the base layer 109. The first insulating layer 116 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, hafnium oxide, hafnium silicate ($HfSi_xO_y$ (x>0, y>0)), hafnium silicate to which nitrogen is added, hafnium aluminate to which nitrogen is added, or the like. A plasma CVD method, a sputtering method, or the like can be employed. The first insulating layer 116 is not limited to a single layer and may be a stack of different layers. For example, the first insulating layer 116 may be formed in the following manner: a silicon nitride layer ($SiN_y$ (y>0)) is formed by a plasma CVD method as a gate insulating layer A and a silicon oxide layer ($SiO_x$ (x>0)) is stacked over the gate insulating layer A as a gate insulating layer B.

In addition to a sputtering method and a plasma CVD method, the first insulating layer 116 can be formed by a high-density plasma CVD method using microwaves (e.g., a frequency of 2.45 GHz), for example.

In this embodiment, a stack of silicon nitride and silicon oxide is used as the first insulating layer 116. Specifically, a 50-nm-thick silicon nitride layer is formed over the first gate electrode 112a and the second gate electrode 112b, and a 100-nm-thick silicon oxide layer is formed over the silicon nitride layer.

The first insulating layer 116 also functions as a protective layer. With the structure in which the first gate electrode 112a and the second gate electrode 112b which contain Cu are covered with the first insulating layer 116 containing silicon nitride, diffusion of Cu from the first gate electrode 112a and the second gate electrode 112b can be prevented.

In the case where an oxide semiconductor is used for a semiconductor layer that is formed in a later step, the first insulating layer 116 may be formed using an insulating material containing a component similar to that of the oxide semiconductor. In the case where the first insulating layer 116 is a stack of different layers, a layer in contact with the oxide semiconductor is formed using an insulating material containing a component similar to that of the oxide semiconductor. Such a material is compatible with the oxide semiconductor, and the use of such a material for the first insulating layer 116 allows the interface state between the oxide semiconductor and the first insulating layer 116 to be kept favorable. Here, "a component similar to that of the oxide semiconductor" means one or more elements selected from constituent elements of the oxide semiconductor. For example, in the case where the oxide semiconductor is formed using an In—Ga—

Zn-based oxide semiconductor material, gallium oxide is given as an insulating material containing a component similar to that of the oxide semiconductor.

In the case of employing a layered structure, the first insulating layer 116 may have a layered structure of a film formed using an insulating material containing a component similar to that of the oxide semiconductor and a film containing a material different from the component material of the film.

It is preferable that a high-purity gas in which impurities such as hydrogen, water, a compound having a hydroxyl group, and hydride are removed be used as a sputtering gas when the first insulating layer 116 is formed. For example, the purity of the high-purity gas in which impurities are removed, which is introduced into a sputtering apparatus, is 6N (99.9999%) or higher, preferably 7N (99.99999%) or higher (that is, the impurity concentration is 1 ppm or lower, preferably 0.1 ppm or lower).

Next, the semiconductor layer 118 is formed over the first insulating layer 116.

For the semiconductor layer 118, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, gallium arsenide, an oxide semiconductor, and the like. For example, as the semiconductor layer 118, an In—Ga—Zn-based oxide semiconductor is formed to a thickness of 30 nm by a sputtering method with the use of an In—Ga—Zn-based oxide target. Note that the semiconductor layer 118 can be formed by a sputtering method in a rare gas (typically argon) atmosphere, an oxygen atmosphere, or a mixed atmosphere containing a rare gas and oxygen.

It is preferable to use an oxide semiconductor for the semiconductor layer 118. An i-type or substantially i-type oxide semiconductor has extremely high resistance and thus can be regarded as an insulator when used in a transistor in an on state. Therefore, even when a plurality of transistors is formed using a single continuous semiconductor layer, they can be operated individually without interference from each other.

An oxide semiconductor used for the semiconductor layer 118 preferably contains at least indium (In) or zinc (Zn). In particular, In and Zn are preferably contained. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of a lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Z-based oxide may contain another metal element in addition to In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

Note that one embodiment of the disclosed invention is not limited thereto, and a material having an appropriate composition may be used depending on semiconductor characteristics (mobility, threshold, variation, and the like). Further, it is preferable to appropriately set the carrier concentration, the impurity concentration, the defect density, the atomic ratio of a metal element and oxygen, the interatomic distance, the density, or the like in order to obtain necessary semiconductor characteristics.

For example, with an In—Sn—Zn-based oxide, high mobility can be realized relatively easily. However, even with an In—Ga—Zn-based oxide, mobility can be increased by reducing the defect density in the bulk.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$. A variable r may be 0.05, for example. The same can be applied to other oxides.

The oxide semiconductor may be either a single crystal oxide semiconductor or a non-single-crystal oxide semiconductor. In the latter case, the non-single-crystal oxide semiconductor may be either amorphous or polycrystalline. Further, the oxide semiconductor may have either an amorphous structure including a portion having crystallinity or an amorphous structure having no crystalline region.

In an oxide semiconductor in an amorphous state, a flat surface can be obtained with relative ease, so that interface scattering of a transistor can be suppressed, and relatively high mobility can be obtained with relative ease.

In an oxide semiconductor having crystallinity, defects in the bulk can be further reduced and when surface evenness is improved, mobility higher than that of an oxide semiconductor layer in an amorphous state can be realized. In order to improve the surface evenness, the oxide semiconductor is preferably formed over a flat surface. Specifically, the oxide semiconductor may be formed over a surface with an average surface roughness (Ra) of less than or equal to 1 nm, preferably less than or equal to 0.3 nm, more preferably less than or equal to 0.1 nm.

Note that Ra in this specification refers to a centerline average roughness obtained by three-dimensionally expanding a centerline average roughness defined by JIS B0601 so as to be applied to a plane to be measured. The Ra can be expressed as an "average value of absolute values of deviations from a reference plane to a designated plane", and is defined with the following equation.

$$R_a = \frac{1}{S_0} \int_{y1}^{y2} \int_{x1}^{x2} |f(x, y) - Z_0| dx dy \quad \text{[EQUATION 1]}$$

Note that in Equation 1, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and Zo represents average height of a measurement surface. Ra can be measured using an atomic force microscope (AFM).

As an example of an oxide semiconductor having crystallinity, there is an oxide including a crystal with c-axis alignment (also referred to as a C-Axis Aligned Crystal (CAAC)), which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including a CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, part of oxygen may be substituted with nitrogen. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or to a surface of a supporting substrate, and in which metal atoms are arranged in a layered manner or metal atoms and oxygen atoms (or nitrogen atoms) are arranged in a layered manner when a cross section of the film is observed.

The semiconductor layer 118 is preferably formed by a sputtering method in which impurities such as hydrogen, water, a hydroxyl group, and a hydride are less likely to enter the semiconductor layer. Deposition is performed in an oxygen gas atmosphere while the substrate heating temperature is higher than or equal to 100° C. and lower than or equal to 600° C., preferably higher than or equal to 150° C. and lower than or equal to 550° C., more preferably higher than or equal to 200° C. and lower than or equal to 500° C. Note that when Al is used for a wiring layer (e.g., the gate electrode 202) formed by etching the first conductive layer, the substrate temperature is set to lower than or equal to 380° C., preferably lower than or equal to 350° C. Note that when Cu is used for a wiring layer formed by etching the first conductive layer, the substrate temperature is set to lower than or equal to 450° C. The thickness of the semiconductor layer 118 is greater than or equal to 1 nm and less than or equal to 40 nm, preferably greater than or equal to 3 nm and less than or equal to 20 nm. As the substrate heating temperature in deposition is higher, the impurity concentration of the obtained semiconductor layer 118 is lower. Further, the atomic arrangement in the semiconductor layer 118 is ordered, the density thereof is increased, so that a polycrystal or a CAAC is readily formed. Furthermore, since an oxygen gas atmosphere is employed for the deposition, an unnecessary atom is not contained in the semiconductor layer 118 unlike in the case of employing a rare gas atmosphere or the like, so that a polycrystal or a CAAC is readily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. Note that as the semiconductor layer 118 is thinner, a short-channel effect of a transistor is reduced. However, when the semiconductor layer 118 is too thin, the semiconductor layer 118 is significantly influenced by interface scattering; thus, the field effect mobility might be decreased.

In order that hydrogen, a hydroxyl group, and moisture may be contained as little as possible in the semiconductor layer 118, it is preferable that the substrate 101 be preheated in a preheating chamber of a sputtering apparatus, for pretreatment before formation of the semiconductor layer 118, so that impurities such as hydrogen and moisture adsorbed onto the substrate 101 and the first insulating layer 116 are eliminated and removed. Note that this preheating treatment may be omitted. Further, this preheating treatment may be similarly performed in a state where components up to and including the first gate electrode 112a and the second gate electrode 112b are formed, before the formation of the first insulating layer 116.

As a target for forming the semiconductor layer 118 by a sputtering method, for example, a metal oxide target having a composition ratio of $In_2O_3:Ga_2O_3:ZnO=1:1:1$ [molar ratio] is used to form an In—Ga—Zn—O-based layer. Without limitation to the material and the composition of the target, for example, a metal oxide target containing $In_2O_3:Ga_2O_3:ZnO=1:1:2$ [molar ratio] may be used.

The filling rate of the metal oxide target is higher than or equal to 90% and lower than or equal to 100%, preferably higher than or equal to 95% and lower than or equal to 99.9%. With the use of the metal oxide target with a high filling rate, the formed oxide semiconductor layer can have high density.

It is preferable that a high-purity gas in which impurities such as hydrogen, water, a compound having a hydroxyl group, and a hydride are removed be used as a sputtering gas when the semiconductor layer 118 is formed. For example, the purity of the high-purity gas in which impurities are removed, which is introduced into a sputtering apparatus, is 6N (99.9999%) or higher, preferably 7N (99.99999%) or higher (that is, the impurity concentration is 1 ppm or lower, preferably 0.1 ppm or lower).

In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, a hydrogen atom, a compound containing a hydrogen atom such as water ($H_2O$), (more preferably, also a compound containing a carbon atom), and the like are evacuated, whereby the impurity concentration in the semiconductor layer 118 formed in the deposition chamber can be reduced.

An example of the deposition conditions is as follows: the distance between the substrate and the target is 100 mm, the pressure is 0.6 Pa, the DC power is 0.5 kW, and an oxygen atmosphere (the flow rate of oxygen is 100%) is used. Note that a pulsed DC power source is preferably used, in which case powder substances (also referred to as particles or dust) that are generated in deposition can be reduced and the film thickness can be uniform.

Note that it has been pointed out that an oxide semiconductor is insensitive to impurities, and there is no problem when a considerable amount of metal impurities is contained in an oxide semiconductor film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). However, such consideration is not appropriate. When the concentration of alkali metals in the oxide semiconductor is measured by secondary ion mass spectroscopy, it is preferred that the sodium (Na) content is $5 \times 10^{16}$ cm$^{-3}$ or less, preferably $1 \times 10^{16}$ cm$^{-3}$ or less, more preferably $1 \times 10^{15}$ cm$^{-3}$ or less; the lithium (Li) content is $5 \times 10^{15}$ cm$^{-3}$ or less, preferably $1 \times 10^{15}$ cm$^{-3}$ or less; and the potassium (K) content is $5 \times 10^{15}$ cm$^{-3}$ or less, preferably $1 \times 10^{15}$ cm$^{-3}$ or less.

An alkali metal and an alkaline earth metal are adverse impurities for the oxide semiconductor and are preferably contained as little as possible. Alkali metal, in particular, a Na ion diffuses from an insulating film to an oxide when the insulating film in contact with the oxide semiconductor is an oxide. In addition, Na cleaves a bond between metal and oxygen or is inserted between the metal-oxygen bond. As a result, deterioration of transistor characteristics (e.g., the shift of a threshold value to the negative side (causing the transistor to be normally on) or a decrease in mobility) is caused. In addition, this also causes variation in the characteristics. Such a problem is significant especially in the case where the hydrogen concentration in the oxide semiconductor is extremely low. Therefore, the concentration of an alkali metal is strongly required to be set to the aforementioned value in the case where the hydrogen concentration in the oxide semiconductor is lower than or equal to $5 \times 10^{19}$ cm$^{-3}$, particularly in the case where it is lower than or equal to $5 \times 10^{18}$ cm$^{-3}$.

Even when the semiconductor layer 118 is formed by the method described above, the semiconductor layer 118 contains moisture or hydrogen (including a hydroxyl group) as an impurity in some cases. Moisture or hydrogen easily forms donor levels and thus serves as an impurity in the oxide semiconductor. In order to reduce impurities such as moisture and hydrogen in the semiconductor layer 118 (dehydrate or dehydrogenate the semiconductor layer 118), the semiconductor layer 118 may be subjected to heat treatment for dehydration or dehydrogenation (hereinafter abbreviated to first heat treatment) in a reduced-pressure atmosphere, an inert gas atmosphere such as a nitrogen atmosphere or a rare gas atmosphere, an oxygen gas atmosphere, or the like.

By performing the first heat treatment on the semiconductor layer 118, moisture or hydrogen at the surface of the semiconductor layer 118 and in the semiconductor layer 118 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When an RTA method is used for the heat treatment, dehydration or dehydrogenation can be performed in a short time; therefore, treatment can be performed even at a temperature higher than the strain point of a glass substrate. Note that when Al is used for a wiring layer (e.g., the gate electrode 202) formed by etching the first conductive layer, the heat treatment temperature is set to lower than or equal to 380° C., preferably lower than or equal to 350° C. Note that when Cu is used for a wiring layer formed by etching the first conductive layer, the heat treatment temperature is set to lower than or equal to 450° C.

Note that a heat treatment apparatus is not limited to an electric furnace, and may include a device for heating an object to be processed by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, a rare gas like argon or an inert gas which does not react with an object to be processed by heat treatment, such as nitrogen, is used.

The first heat treatment is performed in a reduced-pressure atmosphere or an inert gas atmosphere such as a nitrogen atmosphere, a helium atmosphere, a neon atmosphere, or an argon atmosphere. Note that it is preferable that the above atmosphere do not contain moisture, hydrogen, and the like. The purity of nitrogen, or a rare gas such as helium, neon, or argon which is introduced into a heat treatment apparatus is set to 6N (99.9999%) or higher, preferably 7N (99.99999%) or higher (that is, the impurity concentration is 1 ppm or lower, preferably 0.1 ppm or lower).

The semiconductor layer 118 which has been subjected to the first heat treatment may be further subjected to second heat treatment. The second heat treatment is performed in an oxidizing atmosphere in order to supply oxygen into the semiconductor layer 118, whereby oxygen vacancies generated in the semiconductor layer 118 in the first heat treatment can be compensated. Thus, the second heat treatment can be referred to as treatment for supplying oxygen. The second heat treatment may be performed at a temperature of higher than or equal to 200° C. and lower than the strain point of the substrate, and is preferably performed at a temperature of higher than or equal to 250° C. and lower than or equal to 450° C. The treatment time is 3 minutes to 24 hours. As the treatment time is increased, the proportion of a crystal region with respect to that of an amorphous region in the semiconductor layer can be increased. Note that heat treatment for longer than 24 hours is not preferable because the productivity is reduced.

The oxidizing atmosphere is an atmosphere containing an oxidizing gas. Note that the oxidizing gas is oxygen, ozone, nitrous oxide, or the like, and it is preferable that the oxidizing gas do not contain water, hydrogen, and the like. For example, the purity of oxygen, ozone, or nitrous oxide introduced into a heat treatment apparatus is set to 6N (99.9999%) or higher, preferably 7N (99.99999%) or higher (i.e., the impurity concentration is lower than 1 ppm, preferably lower than 0.1 ppm). As the oxidizing atmosphere, an oxidizing gas and an inert gas may be mixed to be used. In that case, the mixture contains an oxidizing gas at a concentration of greater than or equal to 10 ppm. Further, an inert atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

Note that the second heat treatment can be performed using the same heat treatment apparatus and the same gas as those used for the first heat treatment. It is preferable that the first heat treatment for dehydration or dehydrogenation and the second heat treatment for oxygen supply be successively performed. When the first heat treatment and the second heat treatment are successively performed, the productivity of a semiconductor device can be increased.

The semiconductor layer 118 purified by a sufficient reduction in hydrogen concentration, in which defect levels in the energy gap due to oxygen deficiency are reduced as a result of sufficient supply of oxygen, has a carrier concentration of less than $1 \times 10^{12}/cm^3$, less than $1 \times 10^{11}/cm^3$, or less than $1.45 \times 10^{10}/cm^3$. Accordingly, the off-state current (per unit channel width (1 μm) here) at room temperature (25° C.) is 100 zA/μm (1 zA (zeptoampere) is $1 \times 10^{-21}$ A) or lower, or 10 zA/μm or lower. The off-state current at 85° C. is 100 zA/μm ($1 \times 10^{-19}$ A/μm) or lower, or 10 zA/μm ($1 \times 10^{-20}$ A/μm) or lower. A transistor with extremely excellent off-state current characteristics can be obtained with use of such an oxide semiconductor in which the carrier concentration is significantly reduced (also referred to as an i-type (intrinsic) or substantially i-type oxide semiconductor).

The electric characteristics of the transistor, such as the threshold voltage and the on-state current, have almost no temperature dependence. Further, the change in transistor characteristics due to light deterioration hardly occurs.

Thus, variation in electric characteristics of a transistor including a highly purified oxide semiconductor in which the carrier concentration is significantly reduced is suppressed and thus, the transistor is electrically stable. Accordingly, with the use of an oxide semiconductor having stable electric characteristics, a highly reliable light-emitting display device can be provided.

Note that although the case where the first heat treatment and the second heat treatment are performed on the semiconductor layer 118 immediately after the formation of the semiconductor layer 118 is described above, the heat treatment may be performed at any timing as long as it is after the formation of the semiconductor layer 118.

Further, after the formation of the semiconductor layer 118, oxygen adding treatment described below may be first performed on the semiconductor layer 118, and then the first heat treatment may be performed to eliminate hydrogen, a hydroxyl group, or moisture contained in the oxide semiconductor and simultaneously to allow the oxide semiconductor to be crystallized. The crystallization may be performed in a additional heat treatment performed later. Through such crystallization or recrystallization process, the crystallinity of the semiconductor layer 118 can be further improved.

Here, the "oxygen adding treatment" means that oxygen (which includes at least one of an oxygen radical, an oxygen atom, and an oxygen ion) is added to a bulk of the semiconductor layer 118. Note that the term "bulk" is used in order to clarify that oxygen is added not only to a surface of a thin film but also to the inside of the thin film. Further, "oxygen doping" includes "oxygen plasma doping" in which oxygen which is made to be plasma is added to a bulk. When oxygen adding treatment is performed, the amount of oxygen contained in the semiconductor layer 118 can be made larger than that in the stoichiometric ratio. Further, after the formation of the second insulating layer 124 in a subsequent step, the second insulating layer 124 may be subjected to oxygen adding treatment, whereby the amount of oxygen in the second insulating layer 124 can be made larger than that in the stoichiometric ratio. By performing the oxygen adding treatment and then heat treatment on the second insulating layer 124, oxygen in the second insulating layer 124 can be transported to the semiconductor layer 118 to compensate oxygen vacancies in the semiconductor layer 118 efficiently.

The oxygen adding treatment is preferably performed by an inductively coupled plasma (ICP) method, using oxygen plasma excited by microwaves (with a frequency of 2.45 GHz, for example).

Note that the oxygen adding treatment can also be referred to as treatment for supplying oxygen because it is performed so that the amount of oxygen in the semiconductor layer 118, the second insulating layer 124, or the like is larger than that in the stoichiometric ratio. The excess oxygen exists mainly between lattices. When the concentration of oxygen is set to higher than or equal to $1 \times 10^{16}/cm^3$ and lower than or equal to $2 \times 10^{20}/cm^3$, excess oxygen can be contained in the oxide semiconductor without causing crystal distortion or the like.

Figure 5A:
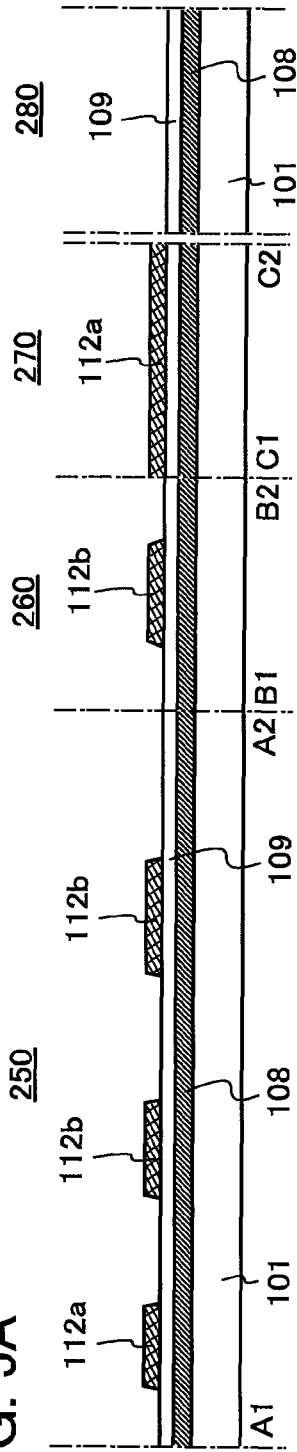
FIGS. 5A to 5C are cross-sectional views illustrating a method for manufacturing a light-emitting display device, according to one embodiment.
Figure 5B:
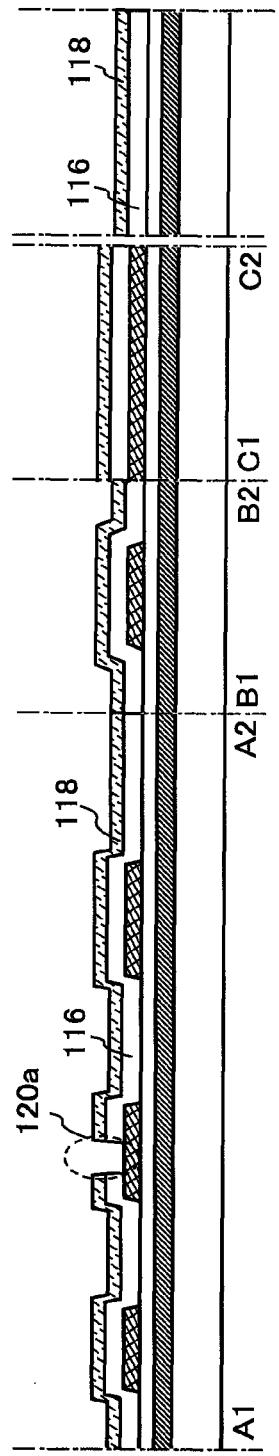

Next, a second resist mask is formed over the semiconductor layer 118, and part of the first insulating layer 116 and part of the semiconductor layer 118 which are over the second gate electrode 112b are selectively etched with the use of the second resist mask to form the first opening 120a (see FIG. 5B).

Note that the etching of the first insulating layer 116 and the semiconductor layer 118 may be performed using either dry etching or wet etching, or using both dry etching and wet etching. For example, when the semiconductor layer 118 is an oxide semiconductor, a mixed solution of phosphoric acid, acetic acid, and nitric acid, or the like can be used as an etchant. Alternatively, ITO-07N (produced by KANTO CHEMICAL CO., INC.) may be used. For the first insulating layer 116, a hydrofluoric acid-based etchant may be used.

Next, a second conductive layer is formed over the first opening 120a and the semiconductor layer 118, a third resist mask is formed over the second conductive layer, and the second conductive layer is partly etched with the use of the third resist mask, so that the first source electrode 122a, the first drain electrode 122b, the second source electrode 122c, and the second drain electrode 122d are formed. In the capacitor 153, a wiring (the second source electrode 122c) is formed so as to overlap with the second gate electrode 112b with the first insulating layer 116 and the semiconductor layer 118 interposed therebetween (see FIG. 5C).

The second conductive layer can be formed to have a single-layer structure or a layered structure using a metal such as molybdenum (Mo), titanium (Ti), tungsten (W), tantalum (Ta), aluminum (Al), copper (Cu), chromium (Cr), neodymium (Nd), or scandium (Sc), or an alloy containing any of these as its main component, for example. Alternatively, the second conductive layer may be formed using a conductive metal oxide. As the conductive metal oxide, indium oxide ($In_2O_3$), tin oxide ($SnO_2$), zinc oxide (ZnO), an indium oxide-tin oxide ($In_2O_3$—$SnO_2$, abbreviated to ITO), an indium oxide-zinc oxide ($In_2O_3$—ZnO), or any of these metal oxide materials containing silicon oxide can be used. Still alternatively, a conductive composition containing a conductive macromolecule (also referred to as a conductive polymer) can be used to form the second conductive layer. As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given. Alternatively, a material formed of 1 to 10 graphene sheets (corresponding to one layer of graphite) may be used.

In this embodiment, a top emission structure where light from the light-emitting element is emitted in the direction opposite to the substrate 101 (the upward direction in FIGS. 5A to 5C) is employed; thus, there is no particular limitation on the second conductive layer. On the other hand, in the case where a bottom emission structure or a dual emission structure is employed and the first source electrode 122a, the first drain electrode 122b, the second source electrode 122c, and the second drain electrode 122d exist in a portion through which emitted light passes (that is, when emitted light is blocked by the first source electrode 122a, the first drain electrode 122b, the second source electrode 122c, and the second drain electrode 122d), it is preferable to form a light-transmitting layer as the second conductive layer.

Since the second conductive layer serves as a wiring, a low resistance material such as Al or Cu is preferably used. With use of Al or Cu, signal delay is reduced, so that higher image quality can be expected. Note that Al has low heat resistance, and thus a defect due to hillocks, whiskers, or migration is easily generated. To prevent migration of Al, a layer of a metal material having a higher melting point than Al, such as Mo, Ti, or W, is preferably stacked over an Al layer, or an alloy layer of Al and an element which prevents hillocks, such as Nd, Ti, Si, or Cu, is preferably used. In the case where a material containing Al is used for the second conductive layer, the maximum process temperature in a later step is preferably set to 380° C. or lower, more preferably 350° C. or lower.

Also in the case where Cu is used for the second conductive layer, in order to prevent a defect due to migration and diffusion of a Cu element, a layer of a metal material having a higher melting point than Cu, such as Mo, Ti, or W, is preferably stacked over the second conductive layer containing Cu. In the case where a material containing Cu is used for the second conductive layer, the maximum process temperature in a later step is preferably set to 450° C. or lower.

In this embodiment, as the second conductive layer, a 5-nm-thick Ti layer is formed over the semiconductor layer 118, and a 250-nm-thick Cu layer is formed over the Ti layer. After that, a second resist mask is formed over the second conductive layer and the second conductive layer is partly etched using the second resist mask, so that the first source electrode 122a, the first drain electrode 122b, the second source electrode 122c, the second drain electrode 122d, and a wiring 122e are formed.

Note that the second resist mask formed over the second conductive layer may be formed by an inkjet method. Formation of the second resist mask by an inkjet method needs no photomask; thus, manufacturing cost can be reduced. The second resist mask is removed after the etching. Description thereof is omitted.

The second conductive layer is preferably etched so that the semiconductor layer 118 is not etched as much as possible. However, it is difficult to obtain etching conditions under which only the second conductive layer is etched. In some cases, the semiconductor layer 118 is partly etched so as to have a groove portion (a recessed portion) in the etching of the second conductive layer.

Figure 5C:
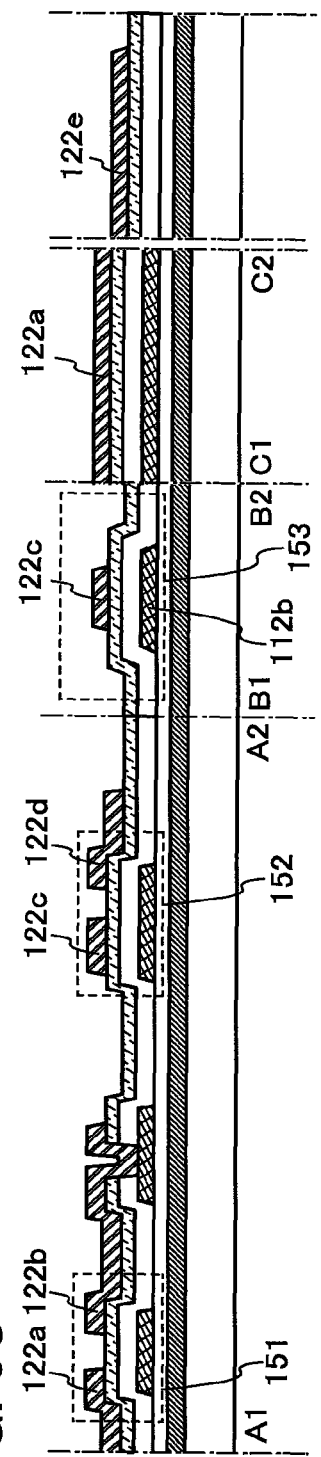

Through the above steps, the first transistor 151, the second transistor 152, and the capacitor 153 are formed (see FIG. 5C). The transistor is a transistor including an oxide semiconductor highly purified by intentionally reducing impurities such as hydrogen, moisture, a hydroxyl group, and a hydride (also referred to as a hydrogen compound) from the semiconductor layer 118. Therefore, variation in the electric characteristics of the transistor is suppressed and thus the transistor is electrically stable.

Then, the second insulating layer 124 is formed so as to cover the above structure formed over the substrate 101 (see FIG. 6A). The second insulating layer 124 can be formed using a material and a method similar to those of the first insulating layer 116 or the base layer 109. A sputtering method is preferably employed for forming the second insulating layer 124 in terms of low possibility of entry of hydrogen and an impurity containing hydrogen. If hydrogen is contained in the second insulating layer 124, hydrogen might enter the semiconductor layer 118 or extract oxygen in the semiconductor layer 118, so that the resistance of the semiconductor layer 118 might be reduced (the semiconductor layer 118 might become n-type) and a parasitic channel might be formed. Therefore, it is important to form the second insulating layer 124 by a method in which hydrogen and impurities containing hydrogen are not contained therein.

For the second insulating layer 124, an inorganic insulating material such as silicon oxide, silicon oxynitride, hafnium oxide, aluminum oxide, or gallium oxide can be used. Gallium oxide is a material which is hardly charged; therefore, variation in threshold voltage due to charge buildup of the insulating layer can be suppressed. Note that in the case where an oxide semiconductor is used for the semiconductor layer 118, a metal oxide layer containing the same kind of component as the oxide semiconductor may be formed as the second insulating layer 124 or stacked over the second insulating layer 124.

In this embodiment, as the second insulating layer 124, a 200-nm-thick silicon oxide layer is formed by a sputtering method. The substrate temperature in deposition may be higher than or equal to room temperature and lower than or equal to 300° C. and in this embodiment, is 100° C. The silicon oxide layer can be formed by a sputtering method in a rare gas (typically, argon) atmosphere, an oxygen atmosphere, or a mixed atmosphere containing a rare gas and oxygen. As a target, a silicon oxide or silicon can be used. For example, with use of silicon for the target, a silicon oxide layer can be formed by sputtering in an atmosphere containing oxygen.

In order to remove moisture remaining in the deposition chamber at the time of formation of the second insulating layer 124, an entrapment vacuum pump such as a cryopump, an ion pump, or a titanium sublimation pump is preferably used. For example, the second insulating layer 124 is formed in the deposition chamber evacuated using a cryopump, whereby the impurity concentration in the second insulating layer 124 can be reduced. Alternatively, as an evacuation unit for removing moisture remaining in the deposition chamber, a turbo molecular pump provided with a cold trap may be used.

It is preferable that a high-purity gas in which impurities such as hydrogen, water, a compound containing a hydroxyl group, and a hydride are removed be used as a sputtering gas when the second insulating layer 124 is formed. For example, the purity of the high-purity gas in which impurities such as hydrogen, water, a compound containing a hydroxyl group, and a hydride are removed is 6N (99.9999%) or higher, preferably 7N (99.99999%) or higher (that is, the impurity concentration is 1 ppm or lower, preferably 0.1 ppm or lower).

After the second insulating layer 124 is formed, third heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., more preferably higher than or equal to 250° C. and lower than or equal to 550° C.). Note that in the case where Al is used for one or more of the gate electrode fanned by etching the first conductive layer and the source and drain electrodes formed by etching the second conductive layer, the heat treatment temperature is set to 380° C. or lower, preferably 350° C. or lower. Alternatively, in the case where Cu is used for the wiring layer, the heat treatment temperature is set to 450° C. or lower. For example, the third heat treatment may be performed in a nitrogen atmosphere at 450° C. for one hour. In the third heat treatment, part of the semiconductor layer 118 (channel formation region) is heated in the state where it is in contact with the second insulating layer 124, and thus oxygen can be supplied from the second insulating layer 124 containing oxygen to the semiconductor layer 118 so that oxygen vacancies in the semiconductor layer 118 can be reduced. Note that in the atmosphere at the time of the third heat treatment, impurities such as water and hydrogen are preferably reduced as much as possible as in the deposition chamber where the second insulating layer 124 is formed.

Next, the third insulating layer 126 functioning as a planarization insulating layer is formed over the second insulating layer 124 (see FIG. 6B). The third insulating layer 126 is preferably formed using siloxane or an organic resin such as an acrylic resin, a polyimide, or a polyamide.

A photosensitive resin may be used as the resin.

In this embodiment, a photosensitive acrylic resin is used as the third insulating layer 126. After an opening is formed in the third insulating layer 126 by light exposure (with the use of a photomask), the second insulating layer 124 and the semiconductor layer 118 are etched using the third insulating layer 126 as a mask, so that a second opening 130a and a third opening 130b are formed (see FIG. 6C).

For the etching of the semiconductor layer 118, either dry etching or wet etching or both may be employed. For example, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching.

For the dry etching, a parallel plate reactive ion etching (RIE) method or an inductively coupled plasma (ICP) etching method can be used.

The second opening 130a is formed by etching the third insulating layer 126, the second insulating layer 124, and the semiconductor layer 118. By the formation of the second opening 130a, an unnecessary region of the semiconductor layer 118 is removed and thus the semiconductor layer 118 is divided into island shapes.

The third opening 130b is formed in such a manner that only the third insulating layer 126 and the second insulating layer 124 are etched because the second drain electrode 122d and the wiring 122e which are under the second insulating layer 124 serve as etching stoppers.

In a general method, different photomasks are used and different photolithography processes and etching steps are performed for formation of the second opening 130a to process the semiconductor layer 118 into island shapes and for formation of the third opening 130b to form a contact hole.

According to a manufacturing process described in this embodiment, the second opening 130a and the third opening 130b can be formed through one photolithography process and one etching step. Consequently, the number of photomasks can be reduced and thus the number of photolithography processes and the number of etching steps can be reduced.

In addition, according to the manufacturing process of this embodiment, a resist mask is not directly formed on the semiconductor layer 118, and thus the semiconductor layer 118 is not contaminated in separation step of the photoresist, a cleaning step, and the like. Therefore, a change in electric characteristics of the transistor can be suppressed.

Next, a third conductive layer is formed so as to cover the second opening 130a and the third opening 130b. In this embodiment, the first transistor 151 and the second transistor 152 are n-channel transistors each including an oxide semiconductor for the semiconductor layer 118, and it is preferable to use a material serving as a cathode of a light-emitting element for the third conductive layer to be the first pixel electrode 128. Specifically, as a cathode, a material with a low work function, such as Ca, Al, $CaF_2$, Mg—Ag, or Al—Li, can be used. Note that a light-transmitting conductive film may be used as the third conductive layer. In that case, the material serving as a cathode may be formed over the light-transmitting conductive film thinly so that the material transmits light. As the light-transmitting conductive film, a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, and the like are given. Alternatively, a material faulted of 1 to 10 graphene sheets (corresponding to one layer of graphite) may be used.

Figure 7A:
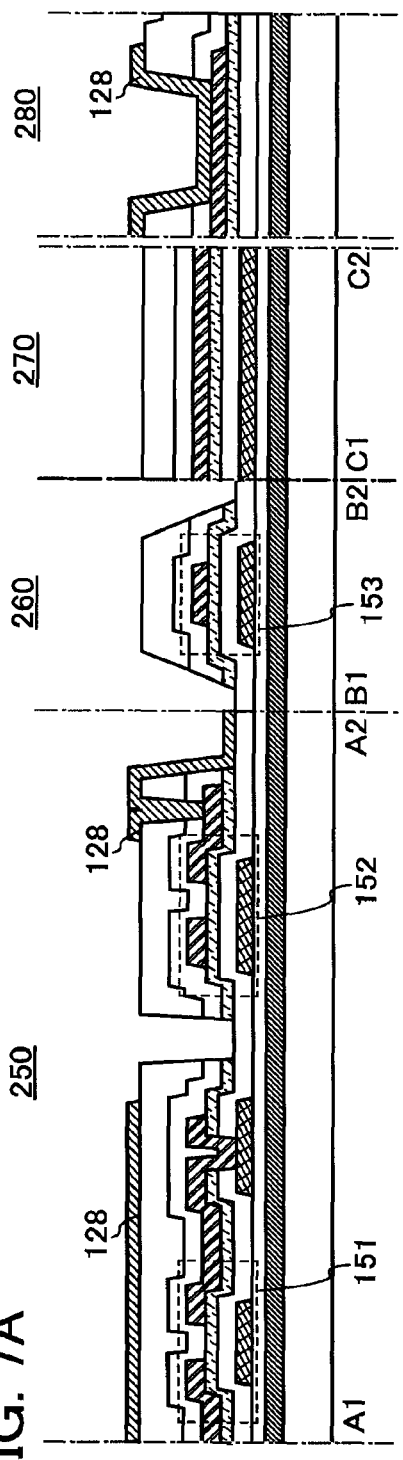
FIGS. 7A and 7B are cross-sectional views illustrating a method for manufacturing a light-emitting display device, according to one embodiment.

Next, a fifth resist mask is formed over the third conductive layer, and etching is performed using the fifth resist mask, so that the first pixel electrode 128 is formed (see FIG. 7A). Note that when an oxide conductive layer of ITO or the like is used for the first pixel electrode 128, an increase in contact resistance with an FPC terminal due to surface oxidation of a metal conductive layer in a lower layer can be suppressed in an FPC connection portion and thus the reliability of a semiconductor device can be improved.

In addition, in the case where an oxide semiconductor which has been made to be i-type (intrinsic) or substantially i-type is used for the semiconductor layer 118, the contact of the first pixel electrode 128 with an end portion of the semiconductor layer 118 (e.g., the contact of a side surface of the semiconductor layer 118 with the first pixel electrode 128 in the second opening 130a) does not cause any problem such as leakage current because the oxide semiconductor which has been made to be i-type (intrinsic) or substantially i-type can be substantially regarded as an insulator.

Further, since the end surfaces of the semiconductor layer 118 are covered with the first pixel electrode 128, impurities from the outside such as hydrogen, water, a compound having a hydroxyl group, a hydride, an alkali metal (e.g., sodium, lithium, and potassium), and an alkaline earth metal can be prevented from reaching the semiconductor layer 118 and adversely affecting electric characteristics and reliability of the transistor.

In this embodiment, a top emission structure where light from the light-emitting element is emitted in the direction opposite to the substrate 101 (the upward direction in FIGS. 5A to 5C) is employed; thus, there is no particular limitation on the third conductive layer. On the other hand, in the case where a bottom emission structure or a dual emission structure is employed and the first pixel electrode 128 formed using the third conductive layer exist in a portion through which emitted light passes (that is, when emitted light is blocked by the first pixel electrode 128), it is preferable to form a light-transmitting layer as the third conductive layer.

Figure 7B:
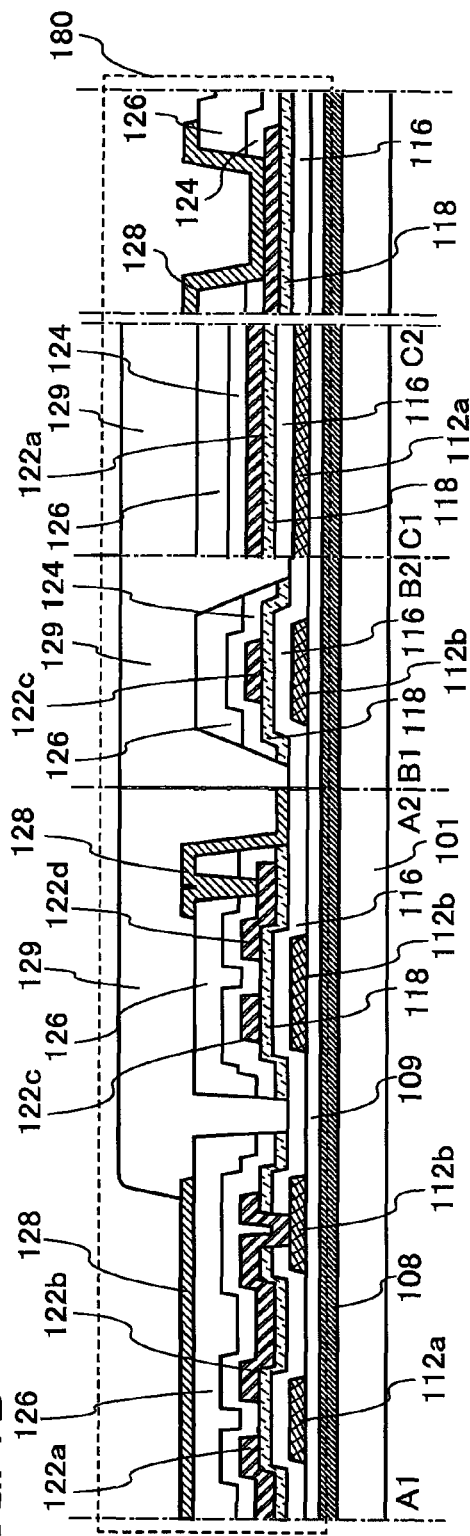

Next, the partition wall 129 is formed over the third insulating layer 126 so as to cover an end portion of the first pixel electrode 128 (see FIG. 7B). For the partition wall 129, an organic material such as a polyimide, a polyamide, a polyimideamide, or a benzocyclobutene-based resin (BCB), an inorganic material containing silicon, such as silicon oxide, silicon nitride, silicon oxynitride, or a stack thereof, or a metal oxide film of aluminum oxide or the like may be used. Alternatively, a layered film of any of the above materials may be used.

By the manufacturing method including the above steps, the element region 180 including at least the first gate electrode 112a, the second gate electrode 112b, the first insulating layer 116, the semiconductor layer 118, the first source electrode 122a, the first drain electrode 122b, the second source electrode 122c, the second drain electrode 122d, the second insulating layer 124, the third insulating layer 126, the first pixel electrode 128, and the partition wall 129 can be formed over the substrate 101 with the separation layer 108 interposed therebetween.

Although not illustrated in the drawing, the transistor provided in the element region 180 is prone to fracture due to static electricity or the like; thus, a protective circuit is preferably provided. The protective circuit is preferably formed using a nonlinear element.

Unlike in the structure obtained by the above method, in a structure without the capacitor 153, the second gate electrode 112b is not provided in a region where a capacitor is formed in FIG. 5A.

A structure without the third insulating layer 126 may be employed. Steps up to a step in FIG. 6A in a manufacturing method of this structure are the same as those in the above method; therefore, the step in FIG. 6A and steps following the step in FIG. 6A will be described below.

A fourth resist mask is formed over the second insulating layer 124 over the substrate which has been obtained through the steps up to the step in FIG. 6A, and the second insulating layer 124 and the semiconductor layer 118 are partly etched with the use of the fourth resist mask, so that the second opening 130a and the third opening 130b are formed (see FIG. 8A).

Next, the third conductive layer is formed so as to cover the second opening 130a and the third opening 130b, a fifth resist mask is formed over the third conductive layer, and the third conductive layer is partly etched with the use of the fifth resist mask, so that the first pixel electrode 128 is formed (see FIG. 8B).

Next, the partition wall 129 is formed over the second insulating layer 124 so as to cover an end portion of the first pixel electrode 128 (see FIG. 8C).

The partition wall 129 is formed using an organic resin film such as polysiloxane, or an inorganic insulating film. It is particularly preferable that an opening be formed over a region which overlaps with the first pixel electrode 128 so that a sidewall of the opening has a tilted surface with continuous curvature.

In this embodiment, a polyimide (PI) film is used for the partition wall 129.

According to this embodiment, a light-emitting display device can be manufactured through fewer photolithography processes as compared with the conventional case. Consequently, a light-emitting display device can be manufactured at low cost with high productivity. Further, the element region 180 needed for operating the light-emitting display device is provided over the substrate 101 with the separation layer 108 interposed therebetween; thus, the element region 180 can be separated from the substrate 101 and transferred to another support.

This embodiment can be freely combined with any of the other embodiments.

(Embodiment 2)

Figure 9A:
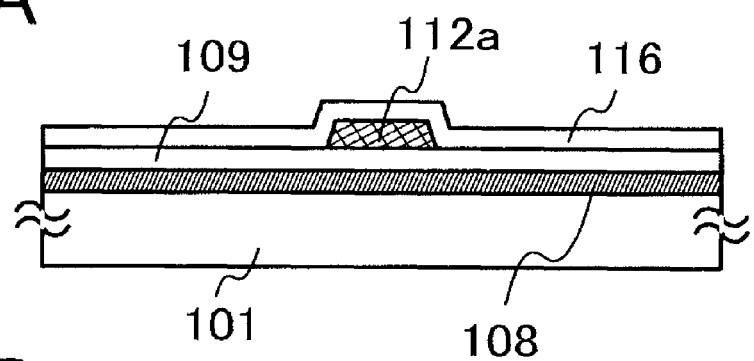
FIGS. 9A to 9C are cross-sectional views illustrating a method for manufacturing a light-emitting display device, according to one embodiment.

In this embodiment, a process example partly different from that described in Embodiment 1 is described with reference to FIGS. 9A to 9C. Note that in FIGS. 9A to 9C, the same reference numerals are used for the same parts as those in FIGS. 5A to 5C, and specific description of the parts with the same reference numerals is omitted here. Further this embodiment is only partly different from Embodiment 1; thus, description is made focusing on only the structure of the transistor 151.

First, as in Embodiment 1, the separation layer 108 is formed over the substrate 101 having an insulating surface, the base layer 109 is formed over the separation layer 108, and a first conductive layer is formed over the base layer 109, a first resist mask is formed over the first conductive layer, and then, the first conductive layer is partly etched using the first resist mask to form the first gate electrode 112a.

In this embodiment, the base layer 109 has a function of preventing diffusion of an impurity element (e.g., Na) from the substrate 101, and may be formed using a film selected from a silicon oxide film, a silicon oxynitride film, a silicon nitride film, a hafnium oxide film, an aluminum oxide film, a gallium oxide film, and a gallium aluminum oxide film. The structure of the base layer 109 is not limited to a single-layer structure, and may be a layered structure of the above films.

In this embodiment, the deposition temperature of a semiconductor film formed later is higher than or equal to 200° C. and lower than or equal to 450° C., and the temperature of heat treatment performed after the formation of the semiconductor film is higher than or equal to 200° C. and lower than or equal to 450° C. Therefore, for the first gate electrode 112a, a layered structure in which copper is a lower layer and molybdenum is an upper layer, or a layered structure in which copper is a lower layer and tungsten is an upper layer is employed.

Next, as in Embodiment 1, the first insulating layer 116 serving as a gate insulating layer is formed over the first gate electrode 112a by a sputtering method, a CVD method, or the like. FIG. 9A is a cross-sectional view illustrating the structure obtained through the steps up to and including this step.

Then, over the first insulating layer 116, a first oxide semiconductor film is formed to a thickness of greater than or equal to 1 nm and less than or equal to 10 nm. In this embodiment, the first oxide semiconductor film is formed to a thickness of 5 nm in an oxygen atmosphere, an argon atmosphere, or a mixed atmosphere of argon and oxygen under the following conditions: a target for an oxide semiconductor (a target for an In—Ga—Zn-based oxide semiconductor ($In_2O_3$:$Ga_2O_3$:ZnO=1:1:2 [molar ratio])) is used; the distance between the substrate and the target is 170 mm; the substrate temperature is 250° C.; the pressure is 0.4 Pa; and the direct current (DC) power is 0.5 kW.

After that, the first heat treatment is performed with the substrate placed in a nitrogen atmosphere or a dry air atmosphere. The temperature of the first heat treatment is set to higher than or equal to 200° C. and lower than or equal to 450° C. In the first heat treatment, heating is performed for greater than or equal to one hour and less than or equal to 24 hours.

Figure 9B:
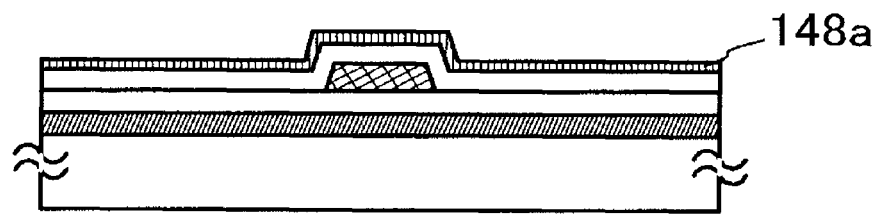
Figure 9C:
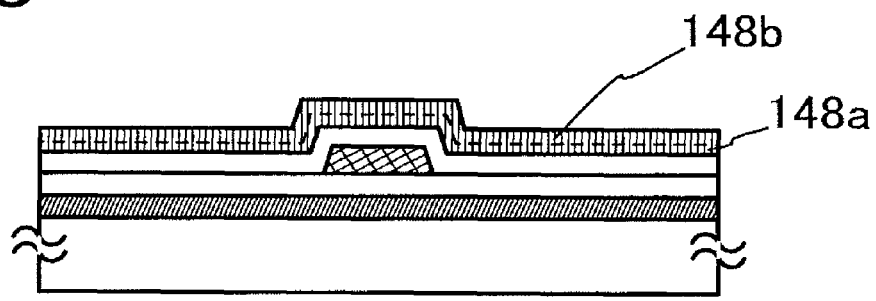

Through the first heat treatment, a first crystalline semiconductor layer 148a is formed (see FIG. 9B).

Next, a second oxide semiconductor film is formed to a thickness of greater than 10 nm over the first crystalline semiconductor layer 148a. In this embodiment, the second oxide semiconductor film is formed to a thickness of 25 nm in an oxygen atmosphere, an argon atmosphere, or a mixed atmosphere of argon and oxygen under the following conditions: a target for an oxide semiconductor (a target for an In—Ga—Zn-based oxide semiconductor ($In_2O_3$:$Ga_2O_3$: ZnO=1:1:2 [molar ratio]) is used; the distance between the substrate and the target is 170 mm; the substrate temperature is 400° C.; the pressure is 0.4 Pa; and the direct current (DC) power is 0.5 kW.

Then, the second heat treatment is performed with the substrate placed in a nitrogen atmosphere or a dry air atmosphere. The temperature of the second heat treatment is set to higher than or equal to 200° C. and lower than or equal to 450° C. In the second heat treatment, heating is performed for greater than or equal to one hour and less than or equal to 24 hours. Through the second heat treatment, a second crystalline semiconductor layer 148b is formed (see FIG. 9C).

Subsequent steps are performed according to Embodiment 1. The second conductive layer, the second insulating layer 124, and the like are formed and the first crystalline semiconductor layer 148a and the second crystalline semiconductor layer 148b are etched with the use of one resist mask. Accordingly, the number of photolithography processes is reduced.

After that, a structure including the first transistor 151 and the second transistor 152, which is illustrated in FIG. 5C, can be obtained by the steps similar to those in Embodiment 1. Note that in the case where this embodiment is employed, the semiconductor layer including a channel formation region of such a transistor has a layered structure of the first crystalline semiconductor layer 148a and the second crystalline semiconductor layer 148b. After the formation of the first crystalline semiconductor layer 148a, the first heat treatment is performed so that the first crystalline semiconductor layer 148a includes a CAAC. Then, the second crystalline semiconductor layer 148b is formed and subjected to the second heat treatment, whereby with the first crystalline semiconductor layer 148a as a seed, a crystal (CAAC) grows in the second crystalline semiconductor layer 148b. Thus, an oxide semiconductor including a CAAC can be formed efficiently.

The transistor having a layered structure of the first crystalline semiconductor layer 148a and the second crystalline semiconductor layer 148b has stable electric characteristics. When the transistor is irradiated with light or subjected to a bias-temperature (BT) test, the amount of change of threshold voltage of the transistor can be reduced.

This embodiment can be freely combined with any of the other embodiments.

(Embodiment 3)

In this embodiment, an example of a structure of a light-emitting display device which is thin, lightweight, and significantly tough and which is manufactured in such a manner that the element region 180 formed in Embodiments 1 and 2 is separated from the substrate 101 and is provided over a different support will be described with reference to FIGS. 10A and 10B. In addition, an example of a method for manufacturing the light-emitting display device will be described with reference to FIGS. 11A and 11B, FIGS. 12A and 12B, and FIGS. 13A and 13B.

Note that as a display element included in the light-emitting display device, a light-emitting element utilizing electroluminescence is used here. Light-emitting elements utilizing electroluminescence are classified according to whether a light-emitting material is an organic compound or an inorganic compound. In general, the former is referred to as an organic EL element, and the latter is referred to as an inorganic EL element. In this specification, description is made assuming that an organic EL element is used as a light-emitting element in the light-emitting display device.

<Example of Structure of Light-emitting Device>

Figure 10A:
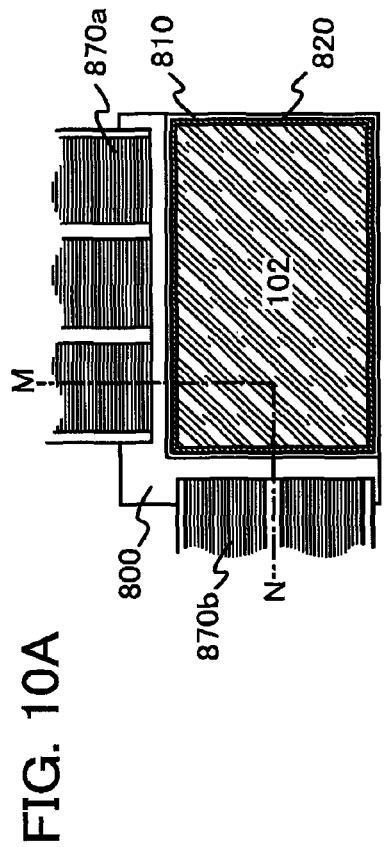
FIGS. 10A and 10B are a plan view and a cross-sectional view illustrating a light-emitting display device according to one embodiment.

FIG. 10A is a plan view illustrating a structural example of a light-emitting display device which is manufactured in such a manner that the element region 180 formed in Embodiments 1 and 2 is separated from the substrate 101 and provided over another support and which is thin, lightweight, and significantly tough. FIG. 10B is a cross-sectional view along dashed-dotted line M-N in FIG. 10A.

Figure 10B:
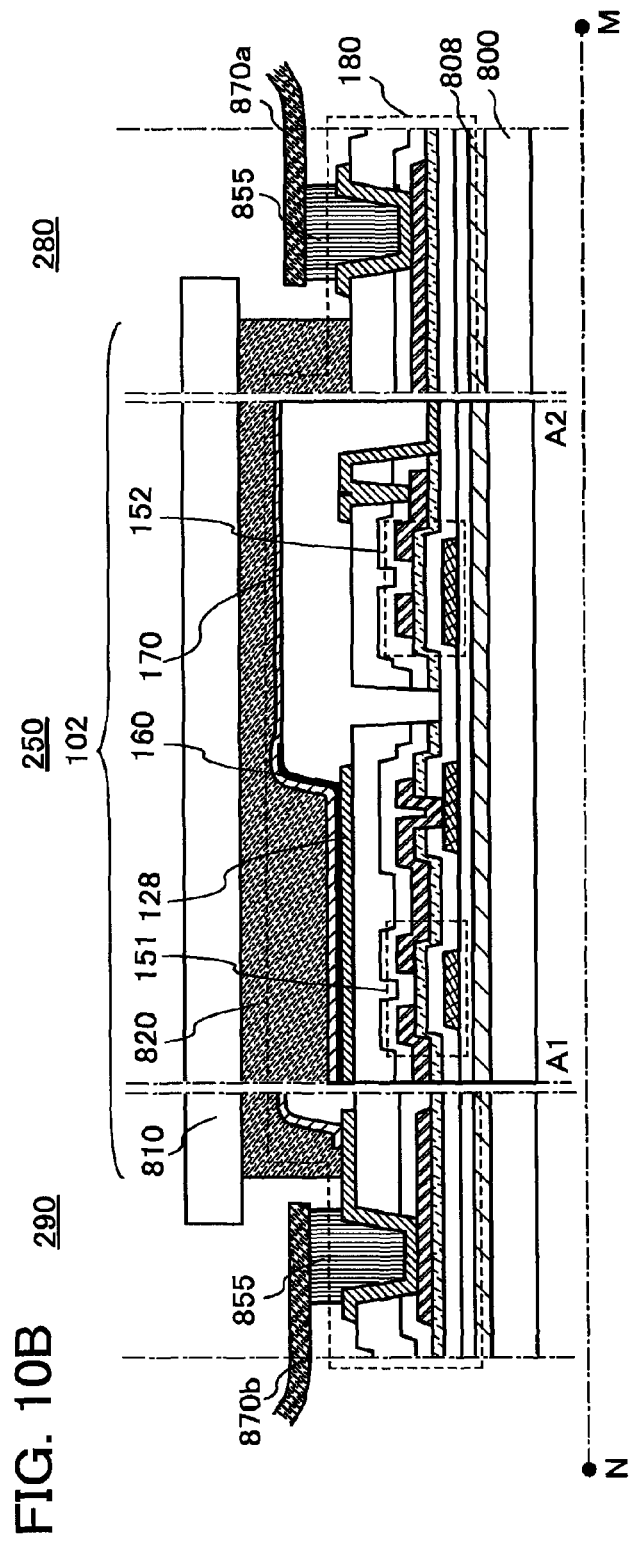

Since the structure of a surface of a panel cannot be entirely illustrated in the cross-sectional view of FIG. 10B, in the cross-sectional structure of the panel in this embodiment, a second external wiring connection portion 290 for transmitting and receiving a signal and power between an external devices and a second pixel electrode 170 formed over a light-emitting element is illustrated together with the transistor portion 250 in the pixel portion and the first external wiring connection portion 280 which are described in Embodiment 1.

The first support 800 has a fracture toughness of greater than or equal to 1.5 [$MPa \cdot m^{1/2}$], and is provided with the element region 180 with an adhesive 808 for fixation interposed therebetween. The light-emitting element 160 is formed over the first pixel electrode 128 in the element region 180 in the pixel region 102, and the second pixel electrode 170 is formed so as to cover the light-emitting element 160. The use of a material whose fracture toughness is greater than or equal to 1.5 [$MPa \cdot m^{1/2}$] for the first support 800 makes it possible to manufacture a light-emitting display device which is thin, lightweight, and significantly tough. Note that the element region 180 includes the light-emitting element 160 and the second pixel electrode 170 in FIG. 10B because it is difficult to show the light-emitting element 160 and the second pixel electrode 170 separately from the element region 180 in indicating the range of the element region 180; however, the element region 180 does not actually include the light-emitting element 160 and the second pixel electrode 170.

The use of a support whose fracture toughness is greater than or equal to 1.5 [$MPa \cdot m^{1/2}$] for the second support 810 makes it possible to manufacture a light-emitting display device which is thin, lightweight, and significantly tough.

A sealant 820 is provided over the element region 180, over which the light-emitting element 160 and the second pixel electrode 170 are formed, so as to cover the pixel region 102. With the sealant 820, the pixel region 102 and the second support 810 are bonded to each other.

The first external wiring connection portion 280 and the second external wiring connection portion 290 are provided over the element region 180 and outside the sealant 820, and external wirings 870a and 870b are connected to a wiring in the element region 180 through a conductive material 855. The external wirings 870a and 870b each have a function of externally supplying power and signals necessary for operating a light-emitting device through the conductive material 855.

With the above structure, a light-emitting display device which is thin, lightweight, and less prone to fracture can be manufactured.

<Method for Manufacturing Light-Emitting Display Device>

Next, an example of a method for manufacturing the light-emitting display device described above will be described with reference to FIGS. 11A and 11B, FIGS. 12A and 12B, and FIGS. 13A and 13B. Note that a manufacturing process of the light-emitting display device in this embodiment will be described by dividing it into a "step of providing an element region over a first support" and "step of forming a light-emitting element and performing sealing".

<Step of Providing Element Region Over First Support>

Figure 11A:
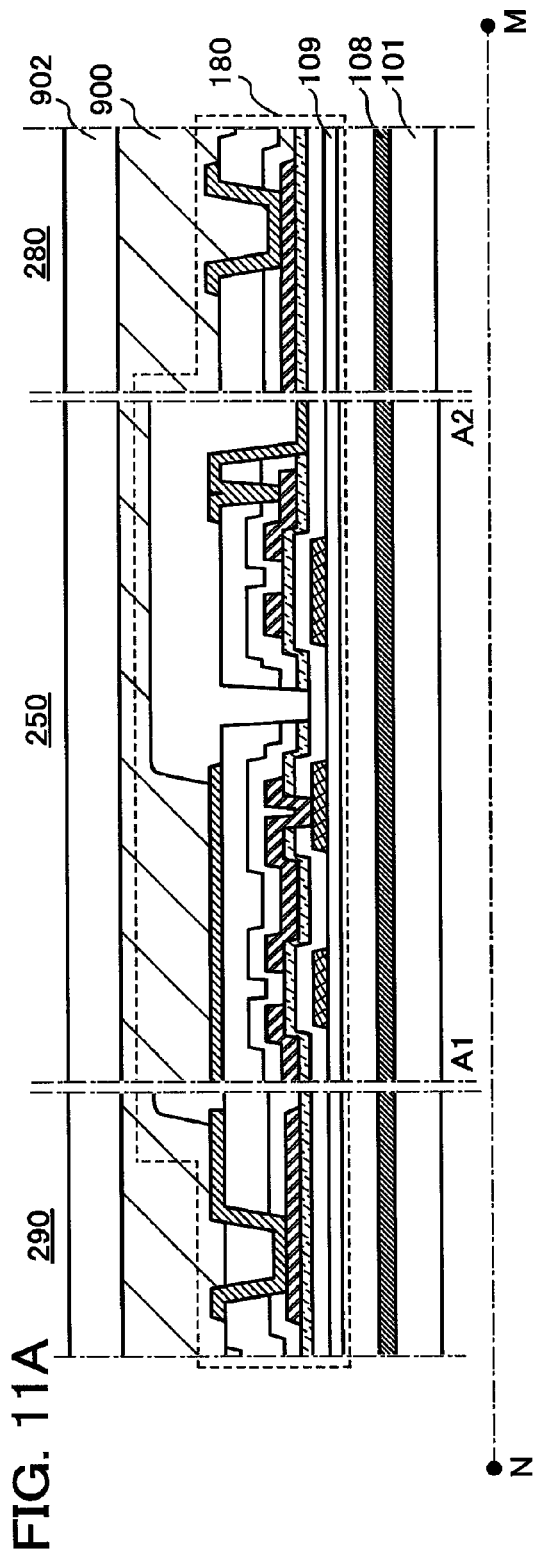
FIGS. 11A and 11B are cross-sectional views illustrating a method for manufacturing a light-emitting display device, according to one embodiment.

First, a temporary supporting base 902 is bonded to a surface of the element region 180 in Embodiment 1, which is formed over the substrate 101 with the separation layer 108 interposed therebetween, with the use of an adhesive 900 for separation, and then the element region 180 is separated from the substrate 101 and transferred to the temporary supporting base 902 (see FIG. 11A). Note that in this specification, this step of separating the element region 180 along the separation layer 108 and transferring the element region 180 to the temporary supporting base 902 is referred to as a transfer step.

As the adhesive 900 for separation, an adhesive which can be removed from the temporary supporting base 902 and the element region 180 as necessary, such as an adhesive which is soluble to water or an organic solvent or an adhesive which can be plasticized by ultraviolet light irradiation. The adhesive 900 for separation is preferably formed to be thin and have a uniform thickness using any of coating machines such as a spin coater, a slit coater, a gravure coater, and a roll coater, or any of printing machines such as a flexible printing machine, an offset printing machine, a gravure printing machine, a screen printing machine, and an inkjet machine.

As the temporary supporting base 902, a tape whose adhesion of a surface can be arbitrarily decreased, such as a UV separation tape and a thermal separation tape, can be used. Alternatively, a glass substrate, a quartz substrate, a sapphire substrate, a ceramic substrate, a metal substrate, a plastic substrate, or the like may be used. Note that in the case where the tape whose adhesion of a surface can be arbitrarily decreased is used, the adhesive 900 for separation is not necessarily required separately. In the case where a plastic substrate is used as the temporary supporting base 902, a plastic substrate having heat resistance high enough to withstand the temperature of a process performed later is preferably used.

Note that there is no particular limitation on the method for bonding the temporary supporting base 902 to the element region 180. When a flexible material such as the tape is used as the temporary supporting base 902, a device which can perform bonding using a roller (also referred to as a roll laminator) may be used, for example. Accordingly, the element region 180 and the temporary supporting base 902 can be reliably bonded to each other without air bubbles and the like therebetween.

In this embodiment, an adhesive which is cured by ultraviolet light irradiation and is soluble to water (hereinafter referred to as a water-soluble adhesive) is used as the adhesive 900 for separation, and is lightly applied to a surface of the element region 180 with a spin coating apparatus, and curing treatment is performed. After that, a UV separation tape (a tape whose adhesion can be weakened by UV irradiation) as a temporary supporting base is adhered to the adhesive 900 for separation with the use of a roll laminator.

Any of various methods can be used as appropriate to separate the element region 180 from the substrate 101. For example, in the case where the separation layer 108 is formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy or compound which contains any of the above elements as a main component, and where a metal oxide film is crystallized to be embrittled and force (force to separate the temporary supporting base 902 from the substrate 101) is applied, so that the element region 180 can be separated along the separation layer 108.

Further, when an amorphous silicon film containing hydrogen is formed as the separation layer 108, the amorphous silicon film containing hydrogen is removed by laser light irradiation or etching, so that the element region 180 can be separated from the substrate 101. When a film containing nitrogen, oxygen, hydrogen, or the like (for example, an amorphous silicon film containing hydrogen, an alloy film containing hydrogen, an alloy film containing oxygen, or the like) is used as the separation layer 108, the separation layer 108 is irradiated with laser light to release nitrogen, oxygen, or hydrogen contained in the separation layer 108 as a gas, so that separation of the element region 180 from the substrate 101 can be promoted. Further, a method in which the separation layer 108 is removed by etching with the use of a halogen fluoride gas such as $NF_3$, $BrF_3$, or $ClF_3$ may be used.

In the case where an organic resin is used for the separation layer 108, stress inherent in the organic resin may be utilized for separation.

Further, the separation process can be facilitated by using plural kinds of separation methods described above in combination. Specifically, the separation can be performed with physical force (by a machine or the like) after performing laser light irradiation on part of the separation layer, etching on part of the separation layer with a gas, a solution, or the like, or removal of part of the separation layer with mechanical force of a sharp knife, a scalpel, or the like, in order that the separation layer and the element region can be easily separated from each other. In the case where the separation layer 108 is formed to have a layered structure of metal and a metal oxide, the layer to be separated can be physically separated easily from the separation layer by using, for example, a groove formed by laser light irradiation or a scratch made by a sharp knife, a scalpel, or the like as a trigger.

Physically separating the element region 180 enables separation in a larger area in a shorter time as compared to a method in which the element region 180 is separated by removing the separation layer with a solution, a gas, or the like. In addition, since a solution and a gas are not used, the level of safety is high. Therefore, as a method for separating the element region 180 from the substrate 101, the method in which force is applied for separation is most advantageous in terms of productivity and safety.

In the case where separation is performed with a physical means, the separation may be performed while a liquid such as water is poured. Thus, an adverse effect on the element region 180 due to static electricity caused by separation operation (e.g., a phenomenon in which a semiconductor element is damaged by static electricity) can be suppressed.

Note that in the case where an oxide semiconductor is used for the semiconductor layer 118, even when static electricity is produced, the semiconductor layer 118 can be prevented from being damaged due to the static electricity. This is because the semiconductor layer 118 has a lower possibility of dielectric breakdown than a general semiconductor layer including a silicon material.

In separation of the element region 180 along the separation layer 108, the substrate 101 is fixed so as not to be moved and bent as much as possible, which enables suppression of force locally applied to the element region 180. Accordingly, the element region 180 can be separated without any problem (e.g., the element region 180 is not cracked). As a method for fixing the substrate 101, for example, a method for fixing the substrate 101 to a stable base using an adhesive material, a method for fixing the substrate 101 using a vacuum chuck, or the like is employed. It is preferable that the substrate 101 be fixed using a vacuum chuck in consideration of trouble for separating the substrate 101 and reuse of the substrate 101. Specifically, a vacuum chuck, which has a porous surface (also referred to as a porous chuck) is preferably used because the entire surface of the substrate 101 can be fixed with uniform force.

Note that before providing the adhesive 900 for separation over the element region 180, fluid-jet cleaning, ultrasonic cleaning, plasma cleaning, UV cleaning, ozone cleaning, or the like is preferably performed on the element region 180 so that dust and organic components attaching to the surface of the element region 180 are removed.

Figure 11B:
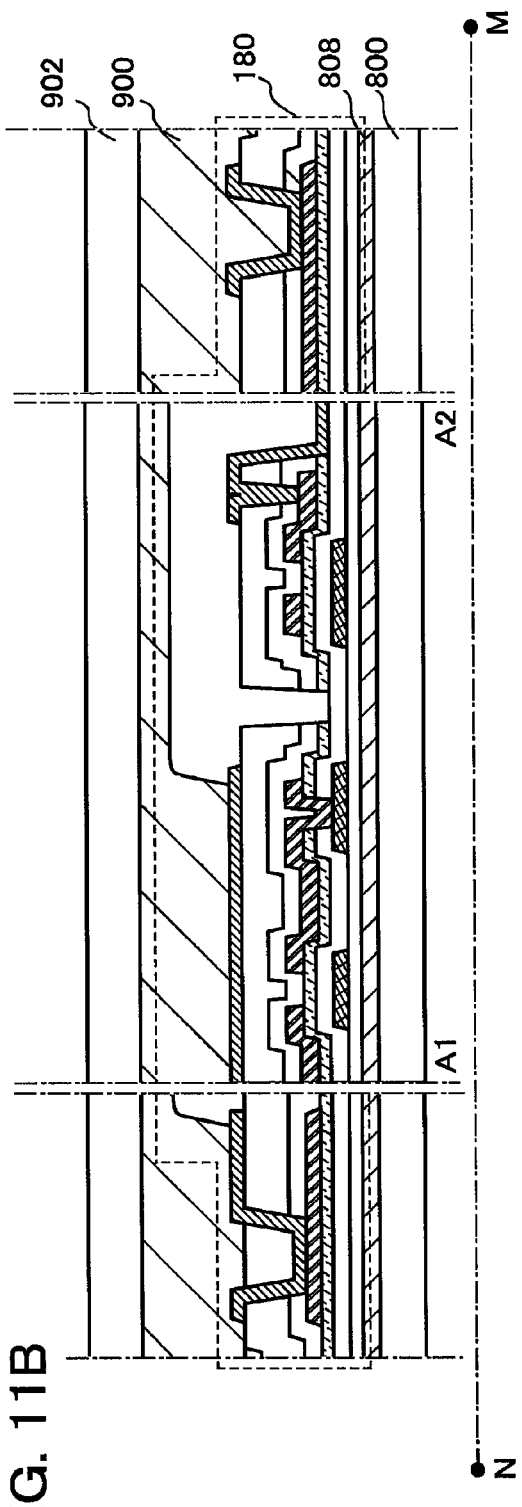

Next, the first support 800 is bonded to the other surface of the element region 180 with the adhesive 808 for fixation interposed therebetween (see FIG. 11B).

As a material of the adhesive 808 for fixation, various curable adhesives, e.g., a light curable adhesive such as a UV curable adhesive, a reactive curable adhesive, a thermal curable adhesive, and an anaerobic adhesive can be used.

The adhesive 808 for fixation is preferably formed to be thin and have a uniform thickness using any of coating machines such as a spin coater, a slit coater, a gravure coater, and a roll coater, or any of printing machines such as a flexible printing machine, an offset printing machine, a gravure printing machine, a screen printing machine, and an inkjet machine.

For the first support 800, any of various materials having high toughness (specifically, the fracture toughness is greater than or equal to 1.5 [MPa·m$^{1/2}$]) is used. For example, an organic resin substrate, an organic resin thin film, a metal substrate, a metal thin film, or the like is used. Thus, a light-emitting display device which is thin, lightweight, and less prone to fracture even in the case where force is applied externally, for example, an impact is made or bending is performed, can be manufactured. Note that various materials having high toughness generally have high flexibility as well as toughness, so that the first support 800 having high toughness can be freely bent. The thickness of the first support 800 may be determined as appropriate depending on use application of a light-emitting display device. For example, when a light-emitting display device is provided while being bent along a shape such as a curved surface, or is rolled up to be carried, the first support 800 may be thin. When a light-emitting display device is used under the condition that force such as an impulse is externally applied, the first support 800 may be thick.

As the organic resin substrate and the organic resin thin film, for example, a substrate and a thin film including as a component at least one kind of resin selected from the following resins can be used: a poly(ethylene terephthalate) (PET) resin, a poly(ether sulfone) (PES) resin, a poly(ethylene naphthalate) (PEN) resin, a poly(vinyl alcohol) (PVA) resin, a polycarbonate (PC) resin, a nylon resin, an acrylic resin, a polyacrylonitrile resin, a polyetheretherketone (PEEK) resin, a polystyrene (PS) resin, a polysulfone (PSF) resin, a polyetherimide (PEI) resin, a polyarylate (PAR) resin, a poly(butylene terephthalate) (PBT) rein, a polyimide (PI) resin, a polyamide (PA) resin, a poly(amide imide) (PAI) resin, a polyisobutylene (PIE) resin, a chlorinated polyether (CP) resin, a melamine (MF) resin, an epoxy (EP) resin, a poly(vinylidene chloride) (PVdC) resin, a polypropylene (PP) resin, a polyacetal (POM) resin, a fluororesin (polytetrafluoroethylene (PTFE)), a phenol (PF) resin, a furan (FF) resin, an unsaturated polyester resin (fiber reinforced plastic (FRP)), a cellulose acetate (CA) resin, a urea (UF) resin, a xylene (XR) resin, a diallyl phthalate (DAP) resin, a poly(vinyl acetate) (PVAc) resin, a polyethylene (PE) resin, and an ABS resin.

As the metal substrate or the metal thin film, for example, aluminum (Al), titanium (Ti), nickel (Ni), chromium (Cr), molybdenum (Mo), tantalum (Ta), beryllium (Be), zirconium (Zr), gold (Au), silver (Ag), copper (Cu), zinc (Zn), iron (Fe), lead (Pb), or tin (Sn), or a substrate or a thin film including an alloy containing any of these elements can be used.

In the case where a top-emission light-emitting display device is employed as in this embodiment, the above material having a thermal expansion coefficient of 20 ppm/° C. or less is preferably selected as a material of the first support 800. With the use of such a material for the first support 800, it is possible to suppress occurrence of a problem such as cracking of the element region 180 due to heat applied to the first support 800. Further, since an organic EL element is used as the light-emitting element, it is preferable to use a material with a low oxygen permeability coefficient and a low vapor permeability coefficient, such as a metal substrate or a metal thin film.

Note that the first support 800 has a single layer structure in this embodiment; however, a protective layer may be formed on a top surface or a bottom surface of the first support 800. As the protective layer, an inorganic thin film such as a silicon oxide ($SiO_2$) film, a silicon nitride (SiN) film, a silicon oxynitride (SiON) film, and a silicon nitride oxide (SiNO) film, a metal film such as an aluminum (Al) film or a magnesium (Mg) film, or an oxide film of any of the metals can be used. In particular, a film with low water vapor permeability, low gas permeability, and low UV transmittance is preferably used. The protective layer is preferably formed by a sputtering method or a plasma CVD method, for example.

In the case of a bottom emission type and a dual emission type, when a metal substrate or a metal thin film is used as the first support, light emitted from the light-emitting element 160 is blocked. Thus, it is preferable to use an organic resin substrate or an organic resin thin film for the first support. It is further preferable to faun a metal oxide film or a thin metal film over a surface of the first support to reduce oxygen permeability coefficient and vapor permeability coefficient.

Although the first support 800 is bonded to the other surface of the element region 180 with the adhesive 808 for fixation interposed therebetween in this embodiment, when a member in which a fibrous body is impregnated with an organic resin (a so-called prepreg) is used as the first support 800, the organic resin with which the fibrous body is impregnated has a function of the adhesive 808 for fixation; thus, the element region 180 and the first support 800 can be bonded to each other without the adhesive 808 for fixation. At this time, as the organic resin for the member, a reactive curable resin, a thermosetting resin, a UV curable resin, or the like which is cured by additional treatment is preferably used.

In this embodiment, a stainless steel film (a so-called SUS film which is made of a material which contains iron as a base and to which chromium, nickel, or the like is added) is used as the first support, and a thermosetting adhesive is lightly applied to a surface of the stainless steel film with a screen printing apparatus. The stainless steel film to which the thermosetting adhesive is applied is attached to the other surface of the element region and curing treatment is performed.

Note that before providing the adhesive 808 for fixation over the first support 800, fluid jet cleaning, ultrasonic cleaning, plasma cleaning, UV cleaning, ozone cleaning, or the like is preferably performed on the first support 800 so that dust and organic components attaching to the surface of the first support 800 are removed.

Further, heat treatment may be performed on the first support 800. By the heat treatment, moisture and impurities attaching to the first support can be removed. Further, by the heat treatment in a reduced pressure state, moisture and impurities can be removed more efficiently. When the heat treatment is performed, a substrate with heat resistance high enough to withstand the heat treatment is preferably used as the first support 800.

Note that as for the cleaning method and the heat treatment, any one of the above cleaning methods and the heat treatment may be selected or two or more of the cleaning methods and the heat treatment may be performed in combination. For example, after fluid-jet cleaning is performed to remove dust attaching to the first support 800, ozone cleaning is performed to remove organic components, and then heat treatment is performed lastly to remove moisture attaching to and absorbed in the first support 800 when the fluid-jet cleaning is performed. In such a manner, dust, organic components and moisture on and in the first support 800 can be effectively removed.

Next, the adhesive 900 for separation and the temporary supporting base 902 are removed from the element region 180 (see FIG. 12A).

In this embodiment, a water-soluble adhesive and a UV separation tape are used as the adhesive 900 for separation and the temporary supporting base 902, respectively. Therefore, UV irradiation treatment is performed to remove the temporary supporting base 902 first, and then the adhesive 900 for separation is removed by cleaning with water.

Due to the high toughness, the first support 800 has enough flexibility to be deformed by application of external stress. Therefore, the temporary supporting base 902 is preferably separated from the element region 180 in the state where a substrate with high rigidity is bonded to the first support 800 with an adhesive material provided between the substrate with high rigidity and the first support 800 so that deformation or fracture is not produced when a load is applied to the first support 800 in separation operation and a later step. When the substrate with high rigidity is thus bonded, a manufacturing apparatus used for a glass substrate or the like can be used as it is.

Through the above steps, the first support 800 whose surface is provided with the element region 180 with the adhesive 808 for fixation interposed therebetween can be manufactured.

<Step of Forming Light-emitting Element and Sealing Step>

Next, the light-emitting element 160 is formed so as to cover the first pixel electrode 128 formed in the element region 180 in the pixel region 102, and the second pixel electrode 170 is formed so as to cover the light-emitting element 160. Note that the second pixel electrode 170 is electrically connected to a wiring portion formed in the second external wiring connection portion 290 (FIG. 12B)

There is no particular limitation on the light-emitting element 160, and a known organic EL element or a known inorganic EL element may be used.

In an organic EL element, by application of voltage to a pair of electrodes (which correspond to the first pixel electrode 128 and the second pixel electrode 170 in this embodiment) between which the light-emitting element is sandwiched, electrons and holes are injected from the pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. With such a mechanism, such a light-emitting element is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

The second pixel electrode 170 is formed so as to cover the light-emitting element 160. The second pixel electrode 170 may be formed using a conductive metal oxide. As the conductive metal oxide, indium oxide ($In_2O_3$), tin oxide ($SnO_2$), zinc oxide (ZnO), an indium oxide-tin oxide ($In_2O_3$—$SnO_2$, abbreviated to ITO), an indium oxide-zinc oxide ($In_2O_3$—ZnO), or any of these metal oxides containing silicon oxide can be used. Alternatively, a conductive composition containing a conductive macromolecule (also referred to as a conductive polymer) can be used to form the second pixel electrode 170. As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given. Still alternatively, a material formed of 1 to 10 graphene sheets (corresponding to one layer of graphite) may be used. The second pixel electrode 170 may be formed using a titanium nitride film or a titanium film instead of the above light-transmitting conductive film. The first pixel electrode 128, the light-emitting element 160, and the second pixel electrode 170 overlap with one another, whereby an EL element is formed. After that, a protective film may be formed over the second pixel electrode 170 and the partition wall 129 in order to prevent entry of oxygen, hydrogen, moisture, carbon dioxide, or the like into the light-emitting element 160. As the protective film, a silicon nitride film, a silicon nitride oxide film, a DLC film, or the like can be formed.

Note that in this embodiment, it is assumed that a top emission structure where light from the light-emitting element 160 is emitted to the second pixel electrode side; thus, the above material is used as the second pixel electrode 170. On the other hand, in the case of a bottom emission structure where light from the light-emitting element 160 is emitted to the first pixel electrode side, the second pixel electrode 170 can be formed to have a single-layer structure or a layered structure using a metal such as molybdenum (Mo), titanium (Ti), tungsten (W), tantalum (Ta), aluminum (Al), copper (Cu), chromium (Cr), neodymium (Nd), or scandium (Sc), or an alloy containing any of these as a main component.

Next, the second support 810 is bonded to the first support 800 with the sealant 820 and the sealant 820 is cured (see FIG. 13A).

Note that the first support 800 and the second support 810 are preferably bonded to each other in a treatment chamber kept under reduced pressure in a vacuum bonding apparatus or the like. With such a method, bonding can be performed without mixture of air bubbles in the sealant 820 or a light-emitting material, and inclusion of an atmospheric component in the region of the sealant 820 can be suppressed.

The curing treatment is performed through one or plural kinds of processes selected from visible light irradiation, UV light irradiation, and heat treatment depending on material components of the sealant 820 such that the cure state of the sealant 820 is optimized.

Although the sealant 820 is provided directly on the second pixel electrode 170 in this embodiment, a film selected from a silicon oxide film, a silicon oxynitride film, a silicon nitride film, a hafnium oxide film, an aluminum oxide film, a gallium oxide film, and a gallium aluminum oxide film, or a stack thereof may be formed over the second pixel electrode 170. In such a case, entry of impurities from the outside into the light-emitting element 160 and the element region 180 can be suppressed.

Next, conductive materials 855 are provided over wirings provided in the first external wiring connection portion 280 and the second external wiring connection portion 290, and the external wiring 870*a* and the external wiring 870*b* are bonded to the conductive materials 855 (see FIG. 13B).

As the conductive material 855, for example, a material including a conductive particle and an organic resin is used. Specifically, a material in which conductive particles each having a diameter of several nanometers to several tens of micrometers are dispersed in an organic resin is used. As the conductive particles, metal particles of one or more of gold (Au), silver (Ag), copper (Cu), nickel (Ni), platinum (Pt), palladium (Pd), tantalum (Ta), molybdenum (Mo), titanium (Ti), aluminum (Al), and carbon (C), an insulating particle whose surface is provided with a metal film containing one or more of the above metals, microparticles of silver halide, or a solder material can be used. In addition, as the organic resin contained in the conductive material 855, one or more of the following can be used: an organic resin serving as a binder of the metal particle, an organic resin serving as a solvent of the metal particle, an organic resin serving as a dispersant of the metal particle, or an organic resin serving as a coating member of the metal particle. Organic resins such as an epoxy resin or a silicone resin can be given as representative examples.

In providing the conductive material 855, any of the following printing machines such as a flexible printing machine, an offset printing machine, a gravure printing machine, a screen printing machine, an inkjet machine, and a dispenser may be used.

In this embodiment, an epoxy resin mixed with flake-like silver particles each with a size of several nanometers to several tens of micrometers is used as the conductive material 855.

As the external wiring 870*a*, for example, a printed wiring board or a flexible printed circuit (FPC) may be used. In the light-emitting display device in this embodiment, both the base substrate and the counter substrate have high toughness and the light-emitting display device may have flexibility; thus, it is preferable that the external wiring 870*a* also have flexibility.

For the connection process, the conductive material 855 may be treated under a condition for curing the conductive material 855 (visible light irradiation, UV light irradiation, or heat treatment). To improve conductivity of the conductive material 855 and to prevent defective conduction between the electrode 222 and the conductive material 855, pressure is preferably applied when the conductive material 855 is subjected to the connection process. Note that the connection process is generally performed using a thermocompression bonding apparatus in which heat treatment is performed while pressure treatment is performed on the conductive material 855 and the external wiring 870*a*.

The element region 180 required for operation of the light-emitting display device manufactured through the above process is manufactured with the use of a smaller number of photomasks than those used in the conventional case. In addition, the element region 180 is sandwiched between the first support 800 and the second support 810 each having a fracture toughness is greater than or equal to 1.5 [MPa·m$^{1/2}$].

Thus, the number of photomasks can be reduced without a complicated technique or a special apparatus, and a light-emitting display device which is thin, lightweight, and significantly tough can be manufactured.

Further, the use of materials with high flexibility for the first support 800 and the second support 810 enables manufacture of a light-emitting display device which can be provided while being bent along a shape such as a curved surface or which can be rolled up to be carried.

This embodiment can be freely combined with any of the other embodiments.

(Embodiment 4)

In this embodiment, an example of an application mode of a semiconductor device according to one embodiment of the present invention will be described. A semiconductor device according to one embodiment of the present invention can be made flexible by being separated from a substrate over which the semiconductor device has been formed. Specific examples of electronic devices including semiconductor devices according to embodiments of the present invention will be described below with reference to FIGS. 14A to 14F. The electronic devices indicate an EL display device, a television device (also referred to as a TV simply, a TV receiver, or a television receiver), a cellular phone, and the like.

Figure 14A:
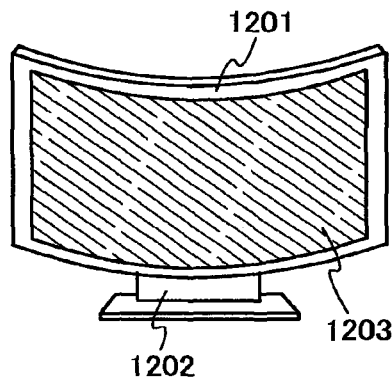
FIGS. 14A to 14F are views each illustrating an application example of an electronic device.

FIG. 14A illustrates a display 1201 which includes a supporting base 1202 and a display portion 1203. The display portion 1203 is formed using a flexible substrate, which can realize a lightweight and thin display. Further, the display portion 1203 can be bent, and can be detached from the supporting base 1202 and the display can be mounted along a curved wall. A flexible display, which is one application mode of a semiconductor device according to one embodiment of the present invention, can be manufactured with the use of the semiconductor device described in the above embodiment for the display portion 1203. Thus, the flexible display can be provided on a curved portion as well as a flat surface; therefore, it can be used for various applications.

Figure 14B:
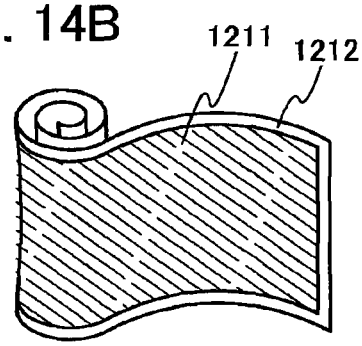

FIG. 14B illustrates a display 1211 capable of being wound, which includes a display portion 1212. A thin and large-area display capable of being wound, which is one application mode of a semiconductor device according to one embodiment of the present invention, can be manufactured with the use of the semiconductor device described in the above embodiment for the display portion 1212. Since the display 1211 capable of being wound is formed using a flexible substrate, the display 1211 can be carried by being bent or wound along with the display portion 1212. Therefore, even in the case where the display 1211 capable of being wound is large, the display 1211 can be carried in a bag by being bent or wound.

Figure 14C:
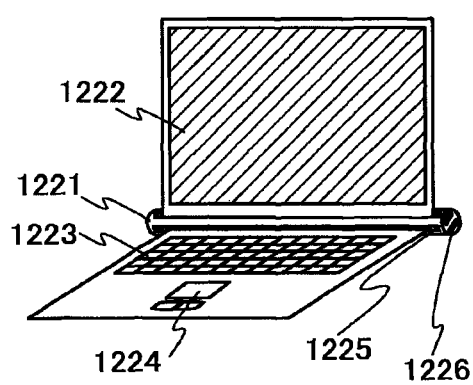

FIG. 14C illustrates a sheet-type computer 1221 which includes a display portion 1222, a keyboard 1223, a touch pad 1224, an external connection port 1225, a power plug 1226, and the like. A thin or sheet-type computer can be manufactured, which is one application mode of a semiconductor device according to one embodiment of the present invention, with the use of the semiconductor device described in the above embodiment for the display portion 1222. The display portion 1222 is formed using a flexible substrate, which can realize a lightweight and thin computer. Further, the display portion 1222 can be wound and stored in a main body when a portion of the main body of the sheet-type computer 1221 is provided with a storage space. Furthermore, by also forming the keyboard 1223 to be flexible, the keyboard 1223 can be wound and stored in the storage space of the sheet-type computer 1221 in a manner similar to that of the display portion 1222, which is convenient for carrying around. The computer can be stored without occupying a space by being bent when it is not used.

Figure 14D:
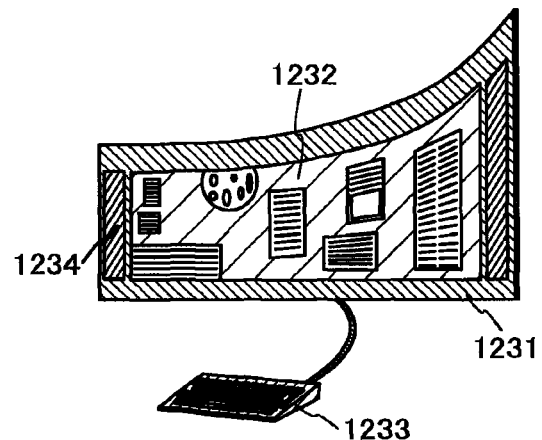

FIG. 14D illustrates a display device 1231 having a 20-inch to 80-inch large-sized display portion, which includes a keyboard 1233 that is an operation portion, a display portion 1232, a speaker 1234, and the like. Since the display portion 1232 is formed using a flexible substrate, the display device 1231 can be carried by being bent or wound with the keyboard 1233 detached. Further, the keyboard 1233 and the display portion 1232 can be connected without wires. For example, the display device 1231 can be mounted along a curved wall and can be operated with the keyboard 1233 without wires.

In the example in FIG. 14D, the semiconductor device described in the above embodiment is used for the display portion 1232. Thus, a thin and large-area display device can be manufactured, which is one application mode of a semiconductor device according to one embodiment of the present invention.

Figure 14E:
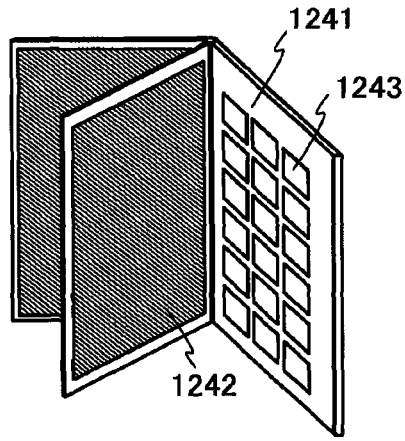

FIG. 14E illustrates an electronic book 1241 which includes a display portion 1242, an operating key 1243, and the like. In addition, a modem may be incorporated in the electronic book 1241. The display portion 1242 is formed using a flexible substrate and can be bent or wound. Therefore, the electronic book can also be carried without occupying a space. Further, the display portion 1242 can display a moving image as well as a still image such as a character.

In the example in FIG. 14E, the semiconductor device described in the above embodiment is used for the display portion 1242. Thus, a thin electronic book can be manufactured, which is one application mode of a semiconductor device according to one embodiment of the present invention.

Figure 14F:
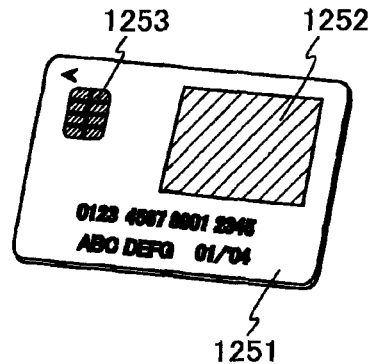

FIG. 14F illustrates an IC card 1251 which includes a display portion 1252, a connection terminal 1253, and the like. Since the display portion 1252 is formed using a flexible substrate to have a lightweight and thin sheet-like shape, it can be attached onto a card surface. When the IC card can receive data without contact, information obtained from outside can be displayed on the display portion 1252.

In the example in FIG. 14F, the semiconductor device described in the above embodiment is used for the display portion 1252. Thus, a thin IC card can be manufactured, which is one application mode of a semiconductor device according to one embodiment of the present invention.

When a semiconductor device according to one embodiment of the present invention is used for an electronic device, even in the case where external force such as bending is applied to the electronic device so that stress is caused thereon, damage of an element such as a transistor can be suppressed; thus, yield and reliability of the semiconductor device can be increased.

As described above, the application range of the present invention is so wide that the present invention can be applied to electronic devices and information displaying means in a wide variety of fields.

(Embodiment 5)

In this embodiment, with use of the light-emitting display device manufactured according to the above embodiment as a display device which switches an image for a left eye and an image for a right eye at high speed, an example in which a 3D image which is a moving image or a still image is seen with dedicated glasses with which videos of the display device are synchronized is described with reference to FIGS. 15A and 15B.

Figure 15A:
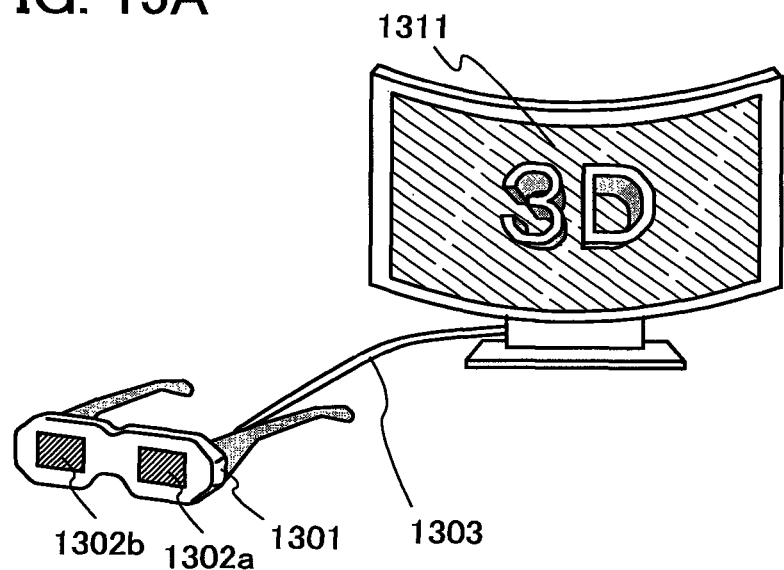
FIGS. 15A and 15B are views illustrating an application example of an electronic device.

FIG. 15A illustrates an external view in which a display device 1311 and dedicated glasses 1301 are connected to each other with a cable 1303. In the dedicated glasses 1301, shutters provided in a panel 1302a for a left eye and a panel 1302b for a right eye are alternately opened and closed, whereby a user can see an image of the display device 1311 as a 3D image.

Figure 15B:
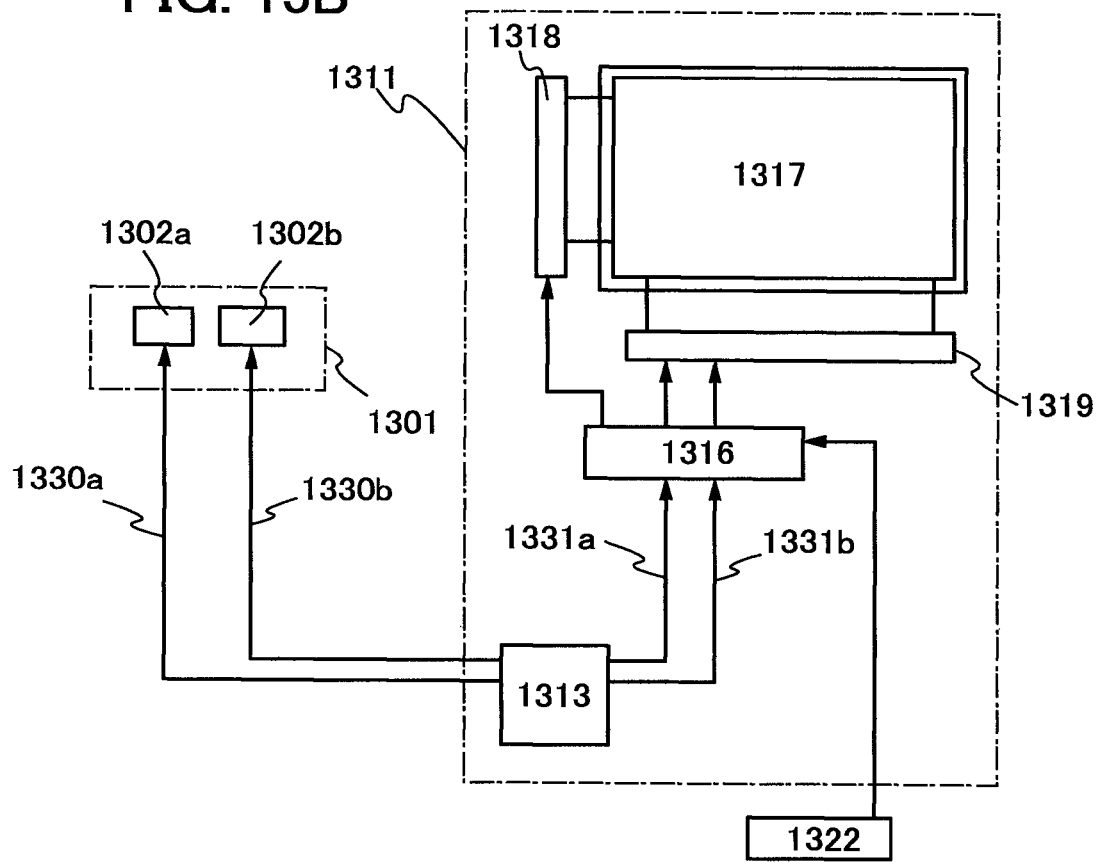

In addition, FIG. 15B is a block diagram illustrating a main structure of the display device 1311 and the dedicated glasses 1301.

The display device 1311 illustrated in FIG. 15B includes a display control circuit 1316, a display portion 1317, a timing generator 1313, a source line driver circuit 1318, an external operation unit 1322, and a gate line driver circuit 1319. A semiconductor device according to one embodiment of the present invention can be used for the display portion 1317. Note that an output signal changes in accordance with operation with the external operation unit 1322 such as a keyboard.

In the timing generator 1313, a start pulse signal and the like are formed, and a signal for synchronizing an image for a left eye and the shutter of the panel 1302a for a left eye, a signal for synchronizing an image for a right eye and the shutter of the panel 1302b for a right eye, and the like are formed.

A synchronization signal 1331a of the image for a left eye is input to the display control circuit 1316, so that the image for a left eye is displayed on the display portion 1317. At the same time, a synchronization signal 1330a for opening the shutter of the panel 1302a for a left eye is input to the panel 1302a for a left eye. In addition, a synchronization signal 1331b of the image for a right eye is input to the display control circuit 1316, so that the image for a right eye is displayed on the display portion 1317. At the same time, a synchronization signal 1330b for opening the shutter of the panel 1302b for a right eye is input to the panel 1302b for a right eye.

Since an image for a left eye and an image for a right eye are switched at high speed, the display device 1311 preferably employs a successive color mixing method (a field sequential method) in which color display is performed by time division with use of light-emitting diodes (LEDs).

Further, since a field sequential method is employed, it is preferable that the timing generator 1313 input the synchronization signals 1330a and 1330b to the backlight portion of the light-emitting diodes. Note that the backlight portion includes LEDs of colors of R, G and B.

This embodiment can be combined with any of the other embodiments in this specification as appropriate.

This application is based on Japanese Patent Application serial no. 2010-204935 filed with the Japan Patent Office on Sep. 13, 2010, the entire contents of which are hereby incorporated by reference.

What is claimed is:

1. A method for manufacturing a light-emitting display device, the method comprising:

forming a separation layer over a substrate;

forming a first gate electrode and a second gate electrode over the separation layer;

forming a gate insulating layer over the first gate electrode and the second gate electrode;

forming an oxide semiconductor layer over the gate insulating layer;

forming a first contact hole over the second gate electrode;
forming a first source electrode, a first drain electrode, a second source electrode, and a second drain electrode over the oxide semiconductor layer so that one of the first source electrode and the first drain electrode is electrically connected to the second gate electrode;
forming an insulating layer over the first source electrode, the first drain electrode, the second source electrode, and the second drain electrode;
forming a second contact hole and a third contact hole simultaneously;
forming a first pixel electrode over the second contact hole and the third contact hole; and
separating the first gate electrode, the second gate electrode, the gate insulating layer, the oxide semiconductor layer, the first source electrode, the first drain electrode, the second source electrode, the second drain electrode, the insulating layer, and the first pixel electrode from the substrate,
wherein the first contact hole is formed in the oxide semiconductor layer and the gate insulating layer to expose the second gate electrode,
wherein the second contact hole is formed in the insulating layer to expose part of one of the second source electrode and the second drain electrode, and
wherein the third contact hole is formed in the insulating layer and the oxide semiconductor layer to expose the gate insulating layer.

2. The method according to claim 1, wherein the first pixel electrode is in contact with the one of the second source electrode and the second drain electrode in the second contact hole.

3. The method according to claim 1, wherein the first pixel electrode is formed so as to be in contact with a side surface of the oxide semiconductor layer in the third contact hole.

4. The method according to claim 1, wherein the first pixel electrode is formed so as to be in contact with a top surface of the gate insulating layer in the third contact hole.

5. The method according to claim 1, further comprising a step of forming a base layer before the formation of the first gate electrode and the second gate electrode.

6. The method according to claim 1, wherein the oxide semiconductor layer comprises an element selected from gallium and indium.

7. A method for manufacturing a light-emitting display device, the method comprising:
forming a separation layer over a substrate;
forming a first gate electrode and a second gate electrode over the separation layer;
forming a gate insulating layer over the first gate electrode and the second gate electrode;
forming an oxide semiconductor layer over the gate insulating layer;
forming a first contact hole over the second gate electrode;
forming a first source electrode, a first drain electrode, a second source electrode, and a second drain electrode over the oxide semiconductor layer so that one of the first source electrode and the first drain electrode is electrically connected to the second gate electrode;
forming an insulating layer over the first source electrode, the first drain electrode, the second source electrode, and the second drain electrode;
forming a second contact hole, a third contact hole, and a fourth contact hole simultaneously;
forming a first pixel electrode over the second contact hole and the third contact hole; and
separating the first gate electrode, the second gate electrode, the gate insulating layer, the oxide semiconductor layer, the first source electrode, the first drain electrode, the second source electrode, the second drain electrode, the insulating layer, and the first pixel electrode from the substrate,
wherein the first contact hole is formed in the oxide semiconductor layer and the gate insulating layer to expose the second gate electrode,
wherein the second contact hole is formed in the insulating layer to expose part of one of the second source electrode and the second drain electrode,
wherein the third contact hole is formed in the insulating layer and the oxide semiconductor layer to expose the gate insulating layer, and
wherein the fourth contact hole is formed in the insulating layer and the oxide semiconductor layer to divide the oxide semiconductor layer into a first oxide semiconductor layer and a second oxide semiconductor layer.

8. The method according to claim 7,
wherein the first gate electrode, the gate insulating layer, the first oxide semiconductor layer, the first source electrode, and the first drain electrode form a first transistor, and
wherein the second gate electrode, the gate insulating layer, the second oxide semiconductor layer, the second source electrode, and the second drain electrode form a second transistor.

9. The method according to claim 7, wherein the first pixel electrode is in contact with the one of the second source electrode and the second drain electrode in the second contact hole.

10. The method according to claim 7, wherein the first pixel electrode is formed so as to be in contact with a side surface of the second oxide semiconductor layer in the third contact hole.

11. The method according to claim 7, wherein the first pixel electrode is formed so as to be in contact with a top surface of the gate insulating layer in the third contact hole.

12. The method according to claim 7, further comprising a step of forming a base layer before the formation of the first gate electrode and the second gate electrode.

13. The method according to claim 7, wherein the oxide semiconductor layer comprises an element selected from gallium and indium.

14. The method according to claim 7, further comprising forming a second insulating layer over the first pixel electrode, wherein the fourth contact hole is filled with the second insulating layer.

* * * * *

UNITED STATES PATENT AND TRADEMARK OFFICE
CERTIFICATE OF CORRECTION

PATENT NO. : 8,647,919 B2
APPLICATION NO. : 13/227074
DATED : February 11, 2014
INVENTOR(S) : Shunpei Yamazaki and Kaoru Hatano Page 1 of 1

It is certified that error appears in the above-identified patent and that said Letters Patent is hereby corrected as shown below:

In the Specification

Column 7, line 59, replace "in (in" with --$m$ ($m$--;

Column 10, line 32, replace "faulted" with --formed--;

Column 14, line 11, replace "(ME)" with --(RIE)--;

Column 17, line 14, replace "Zo" with --$Z_0$--;

Column 25, line 12, replace "fanned" with --formed--;

Column 26, line 33, replace "faulted" with --formed--;

Column 33, line 62, replace "(PIE)" with --(PIB)--;

Column 34, line 42, replace "faun" with --form--;

Column 40, line 51, after "G" insert --,--.

Signed and Sealed this
Eleventh Day of November, 2014

Michelle K. Lee
*Deputy Director of the United States Patent and Trademark Office*